(12) United States Patent
Lee et al.

(10) Patent No.: US 11,411,592 B2
(45) Date of Patent: *Aug. 9, 2022

(54) ANTENNA AND FOLDABLE ELECTRONIC DEVICE INCLUDING THE SAME

(71) Applicant: Samsung Electronics Co., Ltd., Gyeonggi-do (KR)

(72) Inventors: Taeyun Lee, Gyeonggi-do (KR); Yongyoun Kim, Gyeonggi-do (KR); Haeyeon Kim, Gyeonggi-do (KR); Taekyung Lee, Gyeonggi-do (KR); Dongil Yang, Gyeonggi-do (KR); Hyoseok Na, Gyeonggi-do (KR); Soyoung Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/152,855

(22) Filed: Jan. 20, 2021

(65) Prior Publication Data

US 2021/0143853 A1    May 13, 2021

Related U.S. Application Data

(63) Continuation of application No. 16/847,869, filed on Apr. 14, 2020, now Pat. No. 10,931,323.

(30) Foreign Application Priority Data

Apr. 16, 2019    (KR) ........................ 10-2019-0044160

(51) Int. Cl.
*H01Q 1/22*    (2006.01)
*H01Q 9/06*    (2006.01)
(Continued)

(52) U.S. Cl.
CPC ............. *H04B 1/16* (2013.01); *H05K 1/0237* (2013.01); *H05K 1/0277* (2013.01); *H05K 1/111* (2013.01);
(Continued)

(58) Field of Classification Search
CPC .. H01Q 1/22; H01Q 9/14; H01Q 9/06; H01Q 1/2283; H01Q 1/24; H01Q 1/241;
(Continued)

(56) References Cited

U.S. PATENT DOCUMENTS 7,830,313 B2 * 11/2010 Isoda ........................ H01Q 9/16
343/702
10,079,425 B2    9/2018 Chun et al.
(Continued)

FOREIGN PATENT DOCUMENTS

EP    3439103 A1    6/2019
JP    20096115419 A * 4/2006 ............... H01Q 1/24
(Continued)

OTHER PUBLICATIONS

European Search Report dated Feb. 25, 2022.

*Primary Examiner* — Blane J Jackson
(74) *Attorney, Agent, or Firm* — Cha & Reiter, LLC

(57) ABSTRACT

In an embodiment, an electronic device may include a housing including a hinge module, a first housing, and second housing. The first and second housings are rotatably coupled to each other via the hinge module to be in a folded state or an unfolded state. The electronic device may further include a flexible display, at least one conductive pattern disposed in the first housing, at least one conductor disposed at a position in the second housing corresponding to the at least one conductive pattern such that the at least one conductor is capacitively coupled to the conductive pattern when the electronic device is in the folded state, and a (Continued)

wireless communication circuit electrically connected to the at least one conductive pattern in the first housing. Other embodiments are also possible.

19 Claims, 21 Drawing Sheets

(51) Int. Cl.
*H04B 1/40* (2015.01)
*H05K 1/02* (2006.01)
*H04B 1/16* (2006.01)
*H05K 5/00* (2006.01)
*H05K 5/02* (2006.01)
*H05K 1/11* (2006.01)
*H05K 7/14* (2006.01)

(52) U.S. Cl.
CPC ......... *H05K 5/0017* (2013.01); *H05K 5/0226* (2013.01); *H05K 7/1427* (2013.01); *H05K 2201/1003* (2013.01); *H05K 2201/10098* (2013.01)

(58) Field of Classification Search
CPC . H01Q 9/065; H04B 1/16; H04B 1/40; H05K 1/0237; H05K 1/0277; H05K 1/111; H05K 5/0017; H05K 5/0226; H05K 7/1427; H05K 1/02
See application file for complete search history.

(56) References Cited

U.S. PATENT DOCUMENTS

| | | |
|---|---|---|
| 10,181,648 B2 * | 1/2019 | Liu .................. H01Q 9/14 |
| 10,446,911 B2 | 10/2019 | Karilainen |
| 2007/0052596 A1 | 3/2007 | Liu et al. |
| 2010/0013720 A1 | 1/2010 | Sakata et al. |
| 2010/0279747 A1 | 11/2010 | Imano et al. |
| 2011/0234460 A1 * | 9/2011 | Hiraoka .................. H01Q 9/28 343/702 |
| 2016/0211570 A1 | 7/2016 | Jin et al. |
| 2017/0142241 A1 | 5/2017 | Kim et al. |
| 2017/0244818 A1 | 8/2017 | Kim et al. |
| 2018/0366813 A1 | 12/2018 | Kim et al. |
| 2019/0068764 A1 | 2/2019 | Liu et al. |
| 2019/0140342 A1 | 5/2019 | Lim et al. |
| 2020/0195336 A1 | 6/2020 | Raghavan et al. |

FOREIGN PATENT DOCUMENTS

| | | | |
|---|---|---|---|
| JP | 2009206706 A1 * | 9/2009 | .......... H04M 1/0214 |
| JP | 4737937 B2 | 5/2011 | |
| KR | 10-2017-0056292 A | 5/2017 | |
| KR | 10-2017-0066944 A | 6/2017 | |
| WO | WO-2010061609 A1 * | 6/2010 | ............ H01Q 1/243 |

* cited by examiner

ANTENNA AND FOLDABLE ELECTRONIC DEVICE INCLUDING THE SAME

CROSS-REFERENCE TO RELATED APPLICATION(S)

This application is a Continuation of 16/847,869 filed on Apr. 14, 2020 which is based on and claims priority under 35 U.S.C. 119 to Korean Patent Application No. 10-2019-0044160, filed on Apr. 16, 2019, in the Korean Intellectual Property Office, the disclosures of which are herein incorporated by reference in their entireties.

BACKGROUND

Field

The instant disclosure generally relates to an antenna and a foldable electronic device including the same.

Description of Related Art

One of current trends for mobile electronic devices is that users have generally demanded slimmer device bodies. That is, the thickness of the electronic device is reduced as much as possible. In addition, such electronic devices are being developed to increase their stiffness, and to improve the devices in other ways that would differentiate the devices in the market place. These electronic devices are being also developed to have various shapes that depart from the traditional uniform rectangular shape. One example of such developments is embodied in a foldable electronic device with a large-screen display that can be folded when not in use.

The foldable electronic device may include a first housing (or a first housing structure) and a second housing (or a second housing structure) connected to each other through a hinge module (or a hinge structure) interposed therebetween. In the foldable electronic device, the hinge module allows each of the first and second housings to rotate from 0 to 360 degrees with respect to each other. The device may be in-folded, where the display is disposed on the interior of the device when folded, or out-folded, where the display is disposed on the exterior of the device when folded. The foldable electronic device may include a flexible display disposed to substantially cover both the first and second housings in the open (i.e., unfolded) state, where the first and second housing are at 180 degrees with respect to each other.

The foldable electronic device includes at least one antenna for communication. This antenna needs to satisfy the required radiation performance regardless of how the device is folded. However, in the out-folded state of the foldable electronic device where rear surfaces of the first and second housings face each other so that the display is exposed to the exterior, radiation performance may be degraded due to various conductive members shielding the antennas. These conductive members may include conductive layers (e.g., copper plate) of the display, conductive mechanical structures (e.g., conductive support member or conductive bracket) disposed near the antenna in the electronic device, or conductive electrical structure (e.g., interface connector port, speaker assembly, or microphone module) disposed near the antenna in the electronic device.

SUMMARY

Certain embodiments of the instant disclosure provide an antenna and a foldable electronic device including the same.

According to an embodiment of the disclosure, an electronic device may include a housing including a hinge module, a first housing, and second housing. The first housing is connected to the hinge module and includes a first surface, a second surface facing in a direction opposite to the first surface, and a first lateral member surrounding a first space between the first surface and the second surface. The second housing is connected to the hinge module and including a third surface, a fourth surface facing in a direction opposite to the third surface, and a second lateral member surrounding a second space between the third surface and the fourth surface. The first and second housings are rotatably coupled to each other via the hinge module to be in a folded state or an unfolded state. The first and third surfaces face a same direction in the unfolded state, and the second and fourth surfaces face each other in the folded state. The electronic device may further include a flexible display disposed over the first and third surfaces, at least one conductive pattern disposed in the first space, at least one conductor disposed at a position in the second space corresponding to the at least one conductive pattern such that the at least one conductor is capacitively coupled to the at least one conductive pattern when the electronic device is in the folded state, and a wireless communication circuit electrically connected to the in the second space corresponding to the at least one conductive pattern such that the at least one conductor is conductive pattern in the first space.

According to an embodiment of the disclosure, an electronic device may include a housing including a hinge module, a first housing, and second housing. The first housing is connected to the hinge module and includes a first surface, a second surface facing in a direction opposite to the first surface, and a first lateral member surrounding a first space between the first surface and the second surface. The second housing is connected to the hinge module and including a third surface, a fourth surface facing in a direction opposite to the third surface, and a second lateral member surrounding a second space between the third surface and the fourth surface. The first and second housings are rotatably coupled to each other via the hinge module to be in a folded state or an unfolded state. The first and third surfaces face a same direction in the unfolded state, and the second and fourth surfaces face each other in the folded state. The electronic device may further include a flexible display disposed over the first and third surfaces, at least one conductive pattern disposed in the first space, and a first conductive pad disposed in the first space to be exposed through the second surface or disposed at a first position that is closer to the second surface than the first surface. The first conductive pad may be electrically connected to the at least one conductive pattern. The electronic device may further include at least one conductor disposed in the second space, and a second conductive pad disposed in the second space to be exposed through the fourth surface or disposed at a second position that is closer to the fourth surface than the third surface. The second conductive pad may be electrically connected to the at least one conductor, and may be capacitively coupled to the first conductive pad when the electronic device is in the folded state. The electronic device may further include a wireless communication circuit electrically connected to the at least one conductive pattern in the first space, a coupler disposed on an electrical path connecting the wireless communication circuit and the at least one conductive pattern, a tunable circuit disposed on an electrical path connecting the second conductive pad and the at least one conductor, and at least one processor configured to receive return loss information of the at least one conductive pattern from the coupler and, based on the received return loss information, control the tunable circuit.

Additional aspects will be set forth in part in the description which follows and, in part, will be apparent from the description, or may be learned by practice of the presented embodiments.

BRIEF DESCRIPTION OF THE DRAWINGS

The above and other aspects, features and advantages of certain embodiments of the disclosure will be more apparent from the following detailed description, taken in conjunction with the accompanying drawings.

DETAILED DESCRIPTION

According to one or more embodiments of the disclosure, radiation performance of an antenna of a foldable electronic device while folded may be as good as or better than the radiation performance of the antenna when the foldable electronic device is unfolded.

The following description with reference to accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
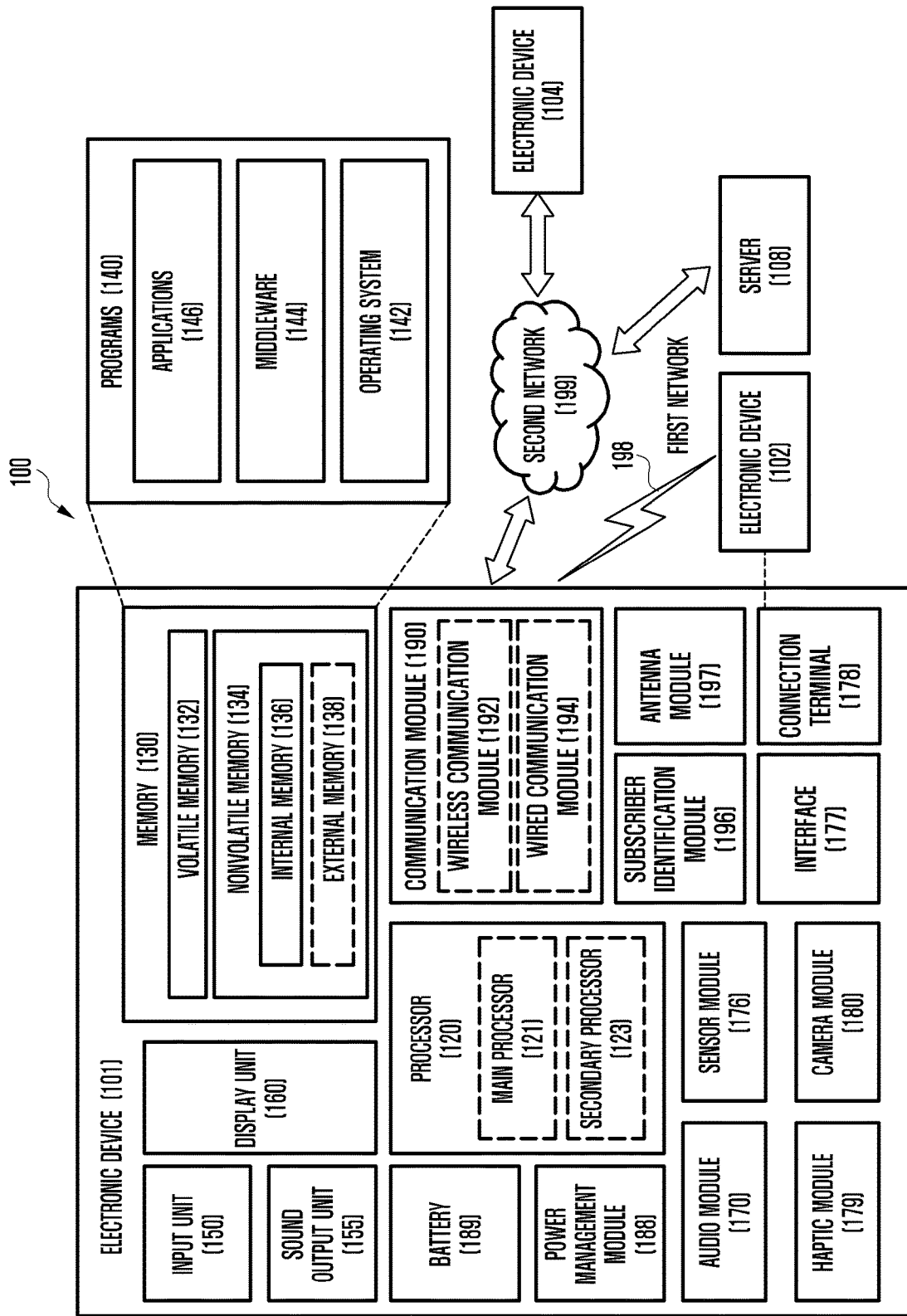
FIG. 1 is a block diagram illustrating an electronic device in a network environment according to various embodiments of the disclosure.

FIG. 1 is a block diagram of an electronic device in a network environment according to an embodiment of the disclosure.

Referring to FIG. 1, in a network environment 100, an electronic device 101 may communicate with a first external electronic device 102 through a first network 198 (e.g., short-range wireless communication network) or may communicate with a second external electronic device 104 or a server 108 through a second network 199 (e.g., long-distance wireless communication network). In one embodiment, the electronic device 101 may communicate with the second external electronic device 104 through the server 108. According to an embodiment, the electronic device 101 may include a processor 120, a memory 130, an input unit 150, a sound output unit 155, a display unit 160, an audio module 170, a sensor module 176, an interface 177, a haptic module 179, a camera module 180, a power management module 188, a battery 189, a communication module 190, a subscriber identification module 196, and an antenna module 197. In one embodiment, at least one component (e.g., the display unit 160 or the camera module 180) among the components of the electronic device 101 may be omitted, or other components may be added to the electronic device 101. In one embodiment, some of these components may be implemented as an integrated circuit. For example, the sensor module 176 (e.g., fingerprint sensor, iris sensor, or illuminance sensor) may be embedded in the display unit 160 (e.g., display).

The processor 120 may execute, for example, software (e.g., a program 140) to control at least one of other components (e.g., hardware component or software component) of the electronic device 101 connected to the processor 120, and may process a variety of data or perform various computations. In one embodiment, as part of data processing or computation, the processor 120 may load a command or data received from other components (e.g., the sensor module 176 or the communication module 190) into the volatile memory 132, process the command or data stored in the volatile memory 132, and store the result data in nonvolatile memory 134. In one embodiment, the processor 120 may include a main processor 121 (e.g., central processing unit, or application processor), and a secondary processor 123 (e.g., graphics processing unit, image signal processor, sensor hub processor, or communication processor), which may operate independently of or in cooperation with the main processor 121. Additionally or alternatively, the secondary processor 123 may consume less power or may be more specialized in a specific function compared with the main processor 121. The secondary processor 123 may be implemented separately from or as part of the main processor 121.

The secondary processor 123 may control at least some of the functions or states associated with at least one component (e.g., the display unit 160, the sensor module 176, or the communication module 190) among the components of the electronic device 101, for example, instead of the main processor 121 while the main processor 121 is in an inactive (e.g., sleep) state, or together with the main processor 121 while the main processor 121 is in an active (e.g., application execution) state. In one embodiment, the secondary processor 123 (e.g., image signal processor or communication processor) may be implemented as a part of another component (e.g., the camera module 180 or the communication module 190) that is functionally related to the secondary processor 123.

The memory 130 may store a variety of data used by at least one component (e.g., the processor 120 or the sensor module 176) of the electronic device 101. The data may include, for example, software (e.g., the program 140) and input data or output data for commands associated with the software. The memory 130 may include the volatile memory 132 or the nonvolatile memory 134.

The programs 140 may be stored in the memory 130 as software, and may include, for example, an operating system 142, a middleware 144, or an application 146.

The input unit 150 may receive a command or data, which can be to be used for a component (e.g., the processor 120) of the electronic device 101, from the outside of the electronic device 101 (e.g., user). The input unit 150 may include, for example, a microphone, a mouse, a keyboard, or a digital pen (e.g., stylus pen).

The sound output unit 155 may output a sound signal to the outside of the electronic device 101. The sound output unit 155 may include, for example, a speaker and a receiver. The speaker may be used for general purposes, such as playback of multimedia or recordings, and the receiver may be used for receiving an incoming call. In one embodiment, the receiver may be implemented separately from or as part of the speaker.

The display unit 160 may visually present information to the outside of the electronic device 101 (e.g., user). The display unit 160 may include, for example, a display, a hologram device, or a projector, and a control circuit for controlling these. In one embodiment, the display unit 160 may include a touch circuitry configured to sense a touch, or a sensing circuitry (e.g., pressure sensor) configured to measure the strength of a force caused by a touch action.

The audio module 170 may convert a sound into an electric signal or convert an electric signal into a sound. In one embodiment, the audio module 170 may obtain a sound signal through the input unit 150 or may output a sound signal through an external electronic device (e.g., the first external electronic device 102 (e.g., speaker or headphone)) wiredly or wirelessly connected to the sound output unit 155 or the electronic device 101.

The sensor module 176 may generate an electrical signal or a data value corresponding to the operating state (e.g., power or temperature) of the electronic device 101 or the environmental state (e.g., user state) outside the electronic device 101. The sensor module 176 may include, for example, a gesture sensor, a gyro sensor, a barometric pressure sensor, a magnetic sensor, an acceleration sensor, a grip sensor, a proximity sensor, a color sensor, an infrared sensor, a biometric sensor, a temperature sensor, a humidity sensor, or an illuminance sensor.

The interface 177 may support one or more designated protocols that enable the electronic device 101 to directly or wirelessly connect to an external electronic device (e.g., the first external electronic device 102). In one embodiment, the interface 177 may include, for example, a high-definition multimedia interface (HDMI), a universal serial bus (USB) interface, an SD card interface, or an audio interface.

The connection terminal 178 may include a connector through which the electronic device 101 can be physically connected to an external electronic device (e.g., the first external electronic device 102). In one embodiment, the connection terminal 178 may include, for example, an HDMI connector, a USB connector, a secure digital (SD) card connector, or an audio connector (e.g., headphone connector).

The haptic module 179 may convert an electrical signal into a mechanical stimulus (e.g., vibration or motion) or an electrical stimulus that can be perceived by the user through tactile or kinesthetic senses. In one embodiment, the haptic module 179 may include, for example, a motor, a piezoelectric element, or an electric stimulator.

The camera module 180 may capture a still image or a moving image. In one embodiment, the camera module 180 may include at least one lens, an image sensor, an image signal processor, or a flash.

The power management module 188 may manage the power supplied to the electronic device 101. The power management module 188 may be implemented as part of a power management integrated circuit (PMIC).

The battery 189 may supply power to at least one component of the electronic device 101. In one embodiment, the battery 189 may include, for example, a non-rechargeable primary cell, a rechargeable secondary cell, or a fuel cell.

The communication module 190 may establish a wired or wireless communication channel between the electronic device 101 and the external electronic device (e.g., the first external electronic device 102, the second external electronic device 104, or the server 108) and support communication through the established communication channel. The communication module 190 may include at least one communication processor that can operate separately from the processor 120 (e.g., application processor) to support wired or wireless communication. In one embodiment, the communication module 190 may include a wireless communication module 192 (e.g., cellular communication module, short-range wireless communication module, or global navigation satellite system (GNSS) communication module), or a wired communication module 194 (e.g., local area network (LAN) communication module, or power line communication module). The corresponding communication module may communicate with an external electronic device through the first network 198 (e.g., short-range communication network such as Bluetooth, Wi-Fi direct, or infrared data association (IrDA)) or through the second network 199 (e.g., long-distance communication network such as a cellular network, the Internet, or a computer network like a LAN or WAN). The above various communication modules may be implemented as one component (e.g., single chip) or as separate components (e.g., multiple chips). The wireless communication module 192 may identify and authenticate the electronic device 101 in the communication network such as the first network 198 or the second network 199 by using subscriber information stored in the subscriber identification module 196.

The antenna module 197 may transmit or receive a signal or power to or from the outside (e.g., the external electronic devices 102 or 104). In one embodiment, the antenna module 197 may include one antenna having a radiator made of a conductor or conductive pattern formed on a substrate (e.g., PCB). In one embodiment, the antenna module 197 may include a plurality of antennas. In this case, at least one antenna suitable for the communication scheme used in the communication network such as the first network 198 or the second network 199 may be selected from the plurality of antennas by, for example, the communication module 190. The signal or power may be transmitted or received between the communication module 190 and the external electronic devices 102 or 104 through the selected at least one antenna. In one embodiment, in addition to the radiator, another component (e.g., radio frequency integrated circuit (RFIC)) may be further formed as part of the antenna module 197.

At least some of the above components may be connected to each other via a communication scheme between peripherals (e.g., bus, general purpose input and output (GPIO), serial peripheral interface (SPI), or mobile industry processor interface (MIPI)), and may exchange signals (e.g., commands or data) with each other.

In one embodiment, commands or data may be exchanged between the electronic device 101 and the second external electronic device 104 through the server 108 connected to the second network 199. The external electronic devices 102 and 104 may be of the same type as or a different type from the electronic device 101. In one embodiment, all or some of the operations that can be performed by the electronic device 101 may be performed by one or more of the external electronic devices 102, 104 and 108. For example, to perform a certain function or service automatically or upon request, the electronic device 101 may, instead of or in addition to executing the function or service, request one or more external electronic devices to execute at least some of the function or service. Upon reception of the request, the external electronic devices may execute at least a portion of the requested function or service or an additional function or service related to the request, and return the execution results to the electronic device 101. The electronic device 101 may further process the received results if necessary and provide the processing results as a response to the requested function or service. To this end, technologies such as cloud computing, distributed computing, and client-server computing may be used.

The electronic device according to various embodiments disclosed herein can be one of various types of devices, such as portable communication devices (e.g., smartphones), computers, portable multimedia devices, portable medical instruments, cameras, wearable devices, and home appliances. However, the electronic device is not limited to the above-mentioned devices.

It should be understood that the various embodiments of the disclosure and the terminology used herein are not intended to limit the techniques described herein to specific embodiments but to include various modifications, equivalents, and/or alternatives thereof. In the drawings, the same or similar reference symbols are used to refer to the same or like parts. In the description, the singular forms "a", "an" and "the" are intended to include the plural forms as well, unless the context clearly indicates otherwise. In the description, the expression "A or B", "at least one of A and/or B", "A, B or C", or "at least one of A, B and/or C" may indicate all possible combinations of the listed items. The terms "first" and "second" may refer to various elements regardless of importance and/or order and are used to distinguish one element from another element without limitation. It will be understood that when an element (e.g., first element) is referred to as being (functionally or communicatively) "coupled with/to" or "connected with/to" another element (e.g., second element), it can be coupled or connected with/to the other element directly (wiredly), wirelessly, or via a third element.

In the description, the term "module" may refer to a certain unit that is implemented in hardware, software, firmware, or a combination thereof. The term "module" may be used interchangeably with the term "unit", "logic", "logical block", "component", or "circuit", for example. The module may be the minimum unit, or a part thereof, which performs one or more particular functions. For example, a module may be implemented in the form of an application-specific integrated circuit (ASIC).

Various embodiments of the disclosure may be implemented in software (e.g., the programs 140) including instructions stored in a machine-readable storage medium (e.g., internal memory 136 or external memory 138) readable by a machine (e.g., the electronic device 101). For example, the processor (e.g., the processor 120) of the machine (e.g., the electronic device 101) can fetch a stored instruction from a storage medium and execute the fetched instruction.

When the instruction is executed by the processor, the machine may perform the function corresponding to the instruction. The instructions may include a code generated by a compiler and a code executable by an interpreter. The machine-readable storage medium may be provided in the form of a non-transitory storage medium. Here, "non-transitory" means that the storage medium does not include a signal and is tangible, but does not distinguish whether data is stored semi-permanently or temporarily in the storage medium.

The method according to various embodiments disclosed herein may be provided as a computer program product. A computer program product may be traded between a seller and a purchaser as a commodity. A computer program product may be distributed in the form of a machine-readable storage medium (e.g., compact disc read only memory (CD-ROM)) or be distributed online (e.g., download or upload) directly between two user devices (e.g. smartphones) through an application store (e.g., Play-Store™). For on-line distribution, at least a portion of the computer program product may be temporarily stored or temporarily created in a storage medium such as a memory of a manufacturer's server, an application store's server, or a relay server.

Each of the components (e.g., modules or programs) according to various embodiments described above may be composed of one or more elements. An existing component may be omitted, and a new component may be added. Alternatively or additionally, some of the components (e.g., modules or programs) may be combined into one entity while maintaining the same functionality. Operations supported by a module, program, or another component may be carried out in sequence, in parallel, by repetition, or heuristically. Some operations may be executed in a different order or may be omitted, and a new operation may be added.

Figure 2:
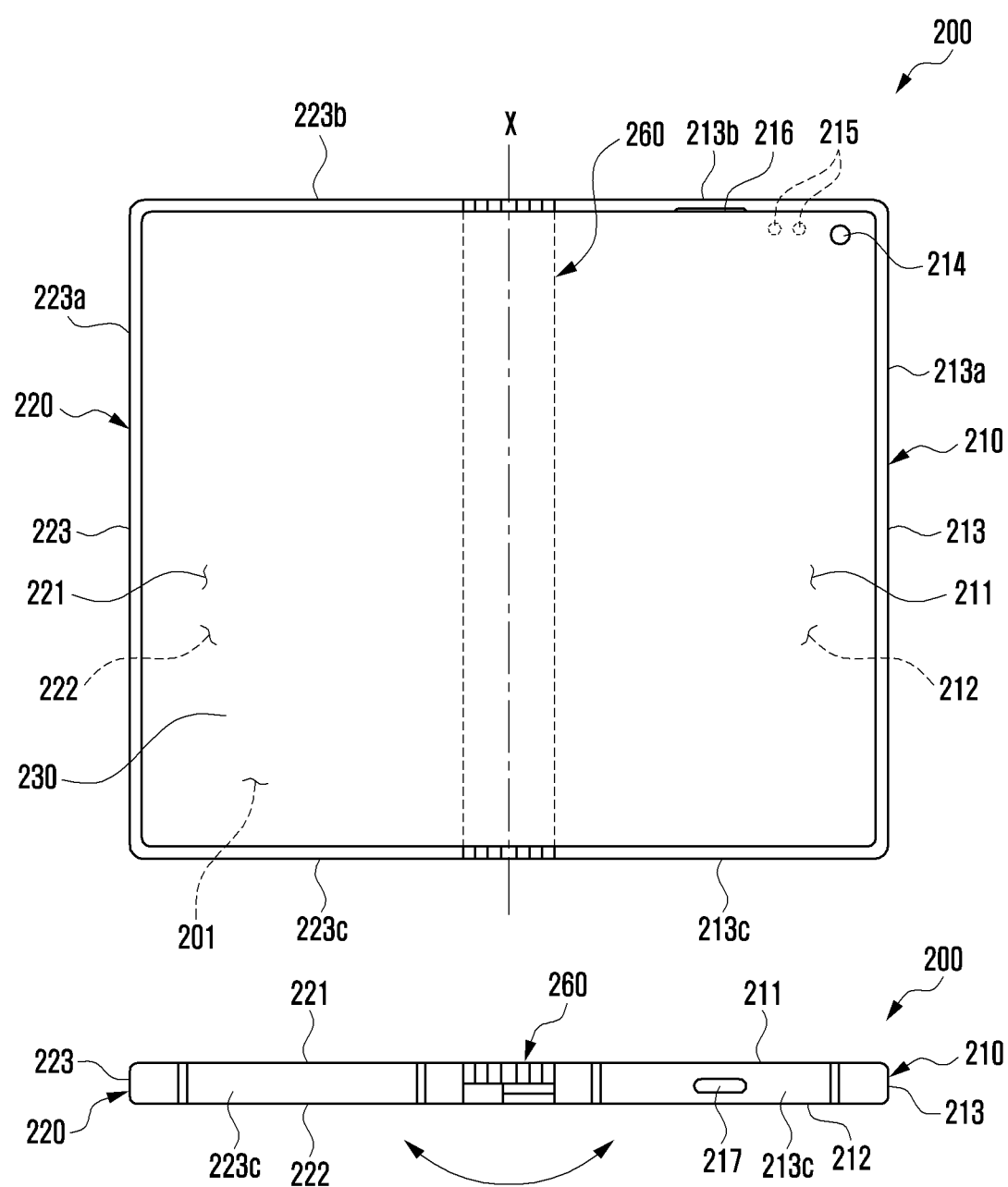
FIG. 2 is a diagram illustrating an unfolded state of a foldable electronic device according to an embodiment of the disclosure.
Figure 3:
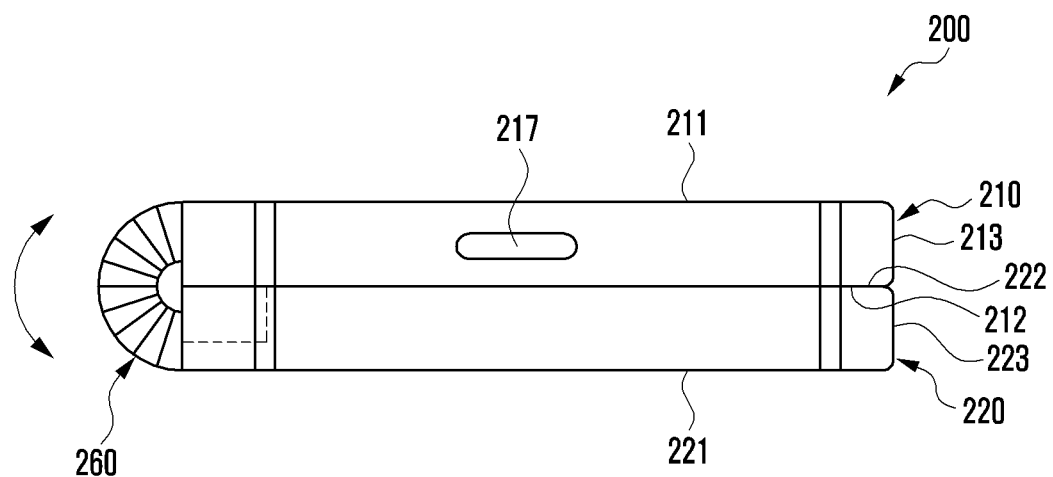
FIG. 3 is a diagram illustrating a folded state of the foldable electronic device shown in FIG. 2.

FIG. 2 is a diagram illustrating an unfolded state of a foldable electronic device 200 according to an embodiment of the disclosure. FIG. 3 is a diagram illustrating a folded state of the foldable electronic device 200 shown in FIG. 2.

The electronic device 200 shown in FIGS. 2 and 3 may be similar, at least in part, to the electronic device 101 shown in FIG. 1, or may be other embodiments of the electronic device.

Referring to FIG. 2, the electronic device 200 may include a pair of housings 210 and 220 and a display 230. The housings 210 and 220 (e.g., the foldable housing structure) may be rotatably combined with each other on an X-axis via a hinge module 260 (e.g., hinge structure) and folded with respect to each other. The display 230 (e.g., flexible display or foldable display) may be disposed in a space formed by the pair of housings 210 and 220. According to an embodiment, at least a portion of the first housing 210 (e.g., first housing structure) and/or of the second housing 220 (e.g., second housing structure) may be made of a metallic or non-metallic material having sufficient rigidity for supporting the display 230. According to an embodiment, when they are metallic, portions of the first housing 210 and/or the second housing 220 may be electrically isolated conductive members that are electrically connected to a wireless communication circuit of the electronic device. This structure may operate as an antenna (e.g., legacy antenna) that operates in a predetermined frequency band.

According to an embodiment, the hinge module 260 may allow the pair of housings 210 and 220 to be folded with respect to each other such that the display 230 is visible from the outside even in the folded state (i.e., the out-folded state). According to an embodiment, the hinge module 260 may include a rail-type hinge module configured to be bendable and at least partially slidable to support the out-folded state.

According to an embodiment, the first housing 210 is connected to the hinge module 260 and includes a first surface 211, a second surface 212, and a first lateral member 213. In the unfolded state of the electronic device 200, the first surface 211 is disposed as the front surface of the electronic device 200, and the second surface 212 faces in a direction opposite to the direction of the first surface 211. The first lateral member 213 surrounds, at least in part, a space between the first surface 211 and the second surface 212. According to an embodiment, the first lateral member 213 may include a first lateral surface 213a, a second lateral surface 213b, and a third lateral surface 213c. The first lateral surface 213a is disposed parallel to the folding axis (i.e., the X-axis). The second lateral surface 213b is extended in a direction perpendicular to the folding axis from one end of the first lateral surface 213a. The third lateral surface 213c is extended in the direction perpendicular to the folding axis from the other end of the first lateral surface 213a.

According to an embodiment, the second housing 220 is connected to the hinge module 260 and includes a third surface 221, a fourth surface 222, and a second lateral member 223. In the unfolded state of the electronic device 200, the third surface 221 is disposed as the front surface of the electronic device 200, and the fourth surface 222 faces in a direction opposite to the direction of the third surface 221. The second lateral member 223 surrounds, at least in part, a space between the third surface 221 and the fourth surface 222. According to an embodiment, the second lateral member 223 may include a fourth lateral surface 223a, a fifth lateral surface 223b, and a sixth lateral surface 223c. The fourth lateral surface 223a is disposed parallel to the folding axis (i.e., the X-axis). The fifth lateral surface 223b is extended in a direction perpendicular to the folding axis from one end of the fourth lateral surface 223a. The sixth lateral surface 223c is extended in the direction perpendicular to the folding axis from the other end of the fourth lateral surface 223a.

According to an embodiment, the first surface 211 and the third surface 221 may include at least one support plate that is formed as a portion of the first and second housings 210 and 220 or structurally combined with the first and second housings 210 and 220 to support the display 230. According to an embodiment, the second surface 212 and the fourth surface 222 may include a rear cover that is formed as a portion of the first and second housings 210 and 220 or structurally combined with the first and second housings 210 and 220. According to an embodiment, the rear cover may be made of various materials such as coated or colored glass, ceramic, polymer, metal (e.g., aluminum, stainless steel (STS), or magnesium), or a combination thereof.

According to an embodiment, in the unfolded state, the electronic device 200 may include a recess 201 provided through both the first surface 211 of the first housing 210 and the third surface 221 of the second housing 220. According to an embodiment, the flexible display 230 may be seated in the recess 201 in the unfolded state. According to an embodiment, the electronic device 200 may include at least one electronic component disposed below at least a portion of the flexible display 230 or exposed through an opening provided in at least a portion of the flexible display 230. According to an embodiment, these electronic components may include at least one camera module 214 exposed through an opening of the flexible display 230 and/or at least one sensor 215 disposed on the rear surface of the flexible display 230. According to an embodiment, the sensor 215 may be various sensors such as proximity sensor, illuminance sensor, iris recognition sensor, ultrasonic sensor, fingerprint recognition sensor, etc. In another embodiment, the electronic components may be disposed in the second housing 220. According to an embodiment, the electronic device 200 may include a receiver 216 or an interface connector port 217 disposed through at least a portion of the first housing 210. According to an embodiment, although not shown, the electronic device 200 may further include an ear jack hole, an external speaker module, a SIM card tray, and/or at least one key button each of which is disposed on or through the first housing 210 and/or the second housing 220.

Figure 4A:
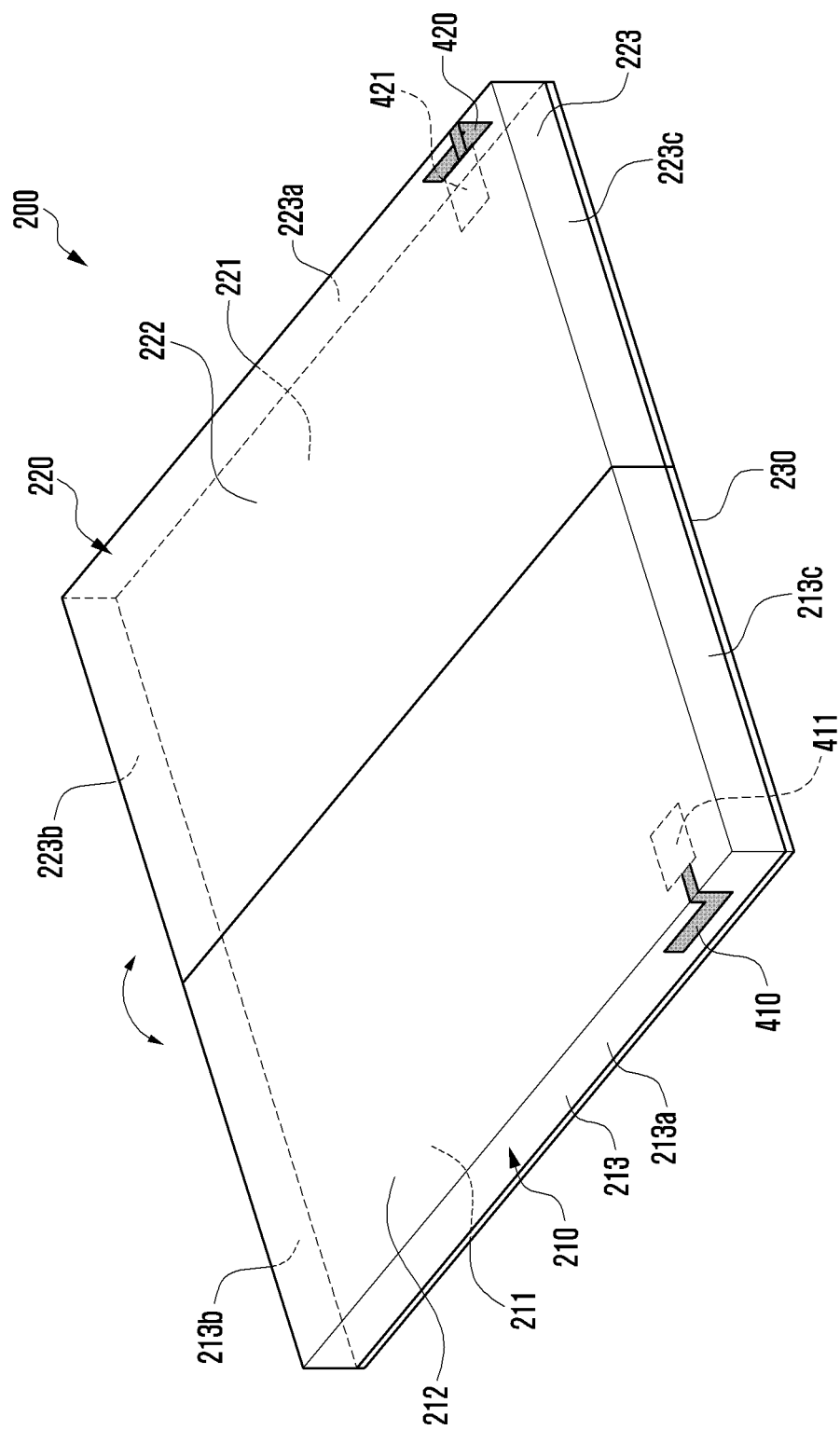
FIG. 4A is a diagram illustrating an unfolded state of a foldable electronic device including an antenna according to an embodiment of the disclosure.
Figure 4B:
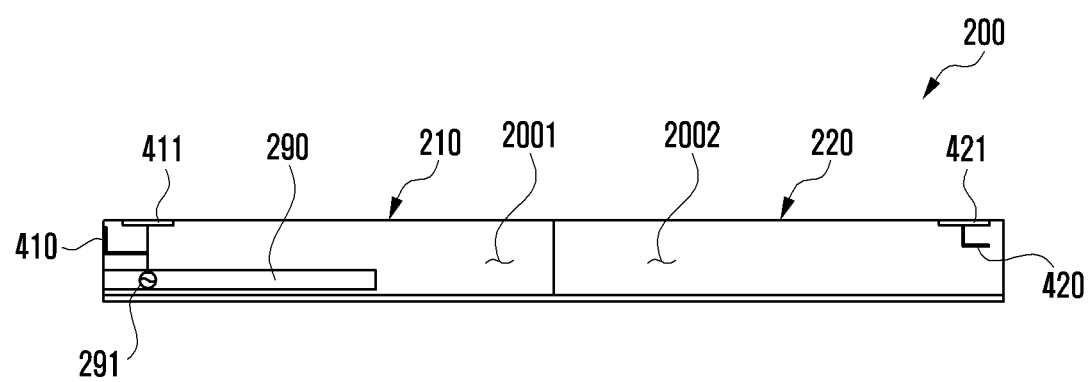
FIG. 4B is a diagram illustrating an internal configuration of the electronic device shown in FIG. 4A.
Figure 4C:
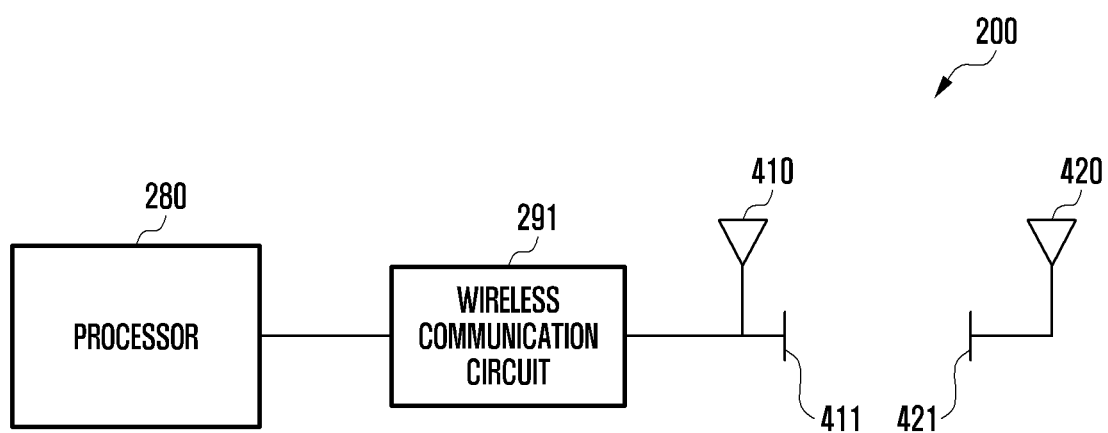
FIG. 4C is a block diagram illustrating the electronic device including an antenna shown in FIG. 4A.

FIG. 4A is a diagram illustrating an unfolded state of a foldable electronic device 200 including an antenna according to an embodiment of the disclosure. FIG. 4B is a diagram illustrating an internal configuration of the electronic device 200 shown in FIG. 4A. FIG. 4C is a block diagram illustrating the electronic device 200 including an antenna shown in FIG. 4A.

Referring to FIGS. 4A to 4C, the electronic device 200 may include a hinge module (e.g., the hinge module 260 in FIG. 2) that allows a first housing 210 and a second housing 220 to be rotatable with respect to each other. According to an embodiment, when the first surface 211 of the first housing 210 and the third surface 221 of the second housing 220 face in the same direction (i.e., in an unfolded state), the flexible display 230 may be unfolded.

According to an embodiment, the electronic device 200 may include a conductive pattern 410 disposed in a first space 2001 of the first housing 210. According to an embodiment, the conductive pattern 410 may be electrically connected to a wireless communication circuit 291 disposed in the first space 2001 of the first housing 210. According to an embodiment, the wireless communication circuit 291 may be mounted on a printed circuit board (PCB) 290 disposed in the first space 2001. According to an embodiment, the wireless communication circuit 291 may be configured to transmit and/or receive radio signals in the range of about 500 MHz to 6000 MHz through the conductive pattern 410. According to an embodiment, the conductive pattern 410 may be operated as a legacy antenna for the wireless communication circuit 291. According to an embodiment, a portion of the conductive pattern 410 may be disposed in the first space 2001 to face the first lateral member 213. According to an embodiment, a portion of the conductive pattern 410 may be disposed to face at least one of the first lateral surface 213*a*, the second lateral surface 213*b*, or the third lateral surface 213*c*. According to an embodiment, the conductive pattern 410 may be made of an injection-molded material (e.g., antenna carrier) which is disposed in the first space 2001 using a laser direct structuring (LDS) method. In another embodiment, the conductive pattern 410 may include a flexible printed circuit board (FPCB) having a conductive plate or pattern disposed at a suitable place in the first space 2001. In another embodiment, the conductive pattern 410 may be formed in a fill-and-cut region (i.e., non-conductive region) of the PCB 290 using a direct patterning method.

According to an embodiment, the electronic device 200 may include a first conductive pad 411 disposed in the first space 2001 of the first housing 210. According to an embodiment, the first conductive pad 411 may be electrically connected to the conductive pattern 410. According to an embodiment, the first conductive pad 411 may be electrically connected to the conductive pattern 410 through an electrical connector such as an FPCB or a coaxial cable. According to an embodiment, the first conductive pad 411 may be exposed through the second surface 212 of the first housing 210 or disposed at a position that is closer to the second surface 212 than the first surface 211 in the first space 2001. According to an embodiment, the first conductive pad 411 may include an FPCB having a conductive plate or pattern of a certain area. In another embodiment, when the first conductive pad 411 is exposed through the second surface 212 of the first housing 210, the first conductive pad 411 may include a decorative member formed of a conductive material.

According to an embodiment, the electronic device 200 may include a conductor 420 disposed in a second space 2002 of the second housing 220. According to an embodiment, the conductor 420 may be another conductive pattern disposed in the second space 2002. According to an embodiment, a portion of the conductor 420 may be disposed in the second space 2002 to face the second lateral member 223. According to an embodiment, a portion of the conductor 420 may be disposed to face at least one of a fourth lateral surface 223*a*, a fifth lateral surface 223*b*, or a sixth lateral surface 223*c*. According to an embodiment, the conductor 420 may be made of an injection-molded material (e.g., antenna carrier) which is disposed in the second space 2002 using the LDS method. In another embodiment, the conductor 420 may include the FPCB having a conductive plate or pattern disposed at a suitable place in the second space 2002.

According to an embodiment, the electronic device 200 may include a second conductive pad 421 disposed in the second space 2002 of the second housing 220. According to an embodiment, in the folded state of the electronic device 200 where the second surface 212 of the first housing 210 and the fourth surface 222 of the second housing 220 face each other (e.g. in contact with each other), the second conductive pad 421 may be disposed at a position so that it electrical couples with the first conductive pad 411, thus being capacitively coupled to the first conductive pad 411. According to an embodiment, the second conductive pad 421 may be electrically connected to the conductor 420. According to an embodiment, the second conductive pad 421 may be electrically connected to the conductor 420 through an electrical connector such as an FPCB or a thin wire cable. According to an embodiment, the second conductive pad 421 may be exposed through the fourth surface 222 of the second housing 220 or disposed at a position that is closer to the fourth surface 222 than the third surface 221 in the second space 2002. According to an embodiment, the second conductive pad 421 may include an FPCB having a conductive plate or pattern of a certain area. In another embodiment, when the second conductive pad 421 is exposed through the fourth surface 222 of the second housing 220, the second conductive pad 421 may include a decorative member formed of a conductive material.

According to an embodiment, in the unfolded state of the electronic device 200, the wireless communication circuit 291 may be configured to transmit and/or receive radio signals in a predetermined frequency band through the conductive pattern 410 disposed in the first space 2001 of the first housing 210. In this case, because the conductor 420 is spaced apart from the conductive pattern 410, and the radiation performance of the conductive pattern 410 may not be affected.

Figure 5A:
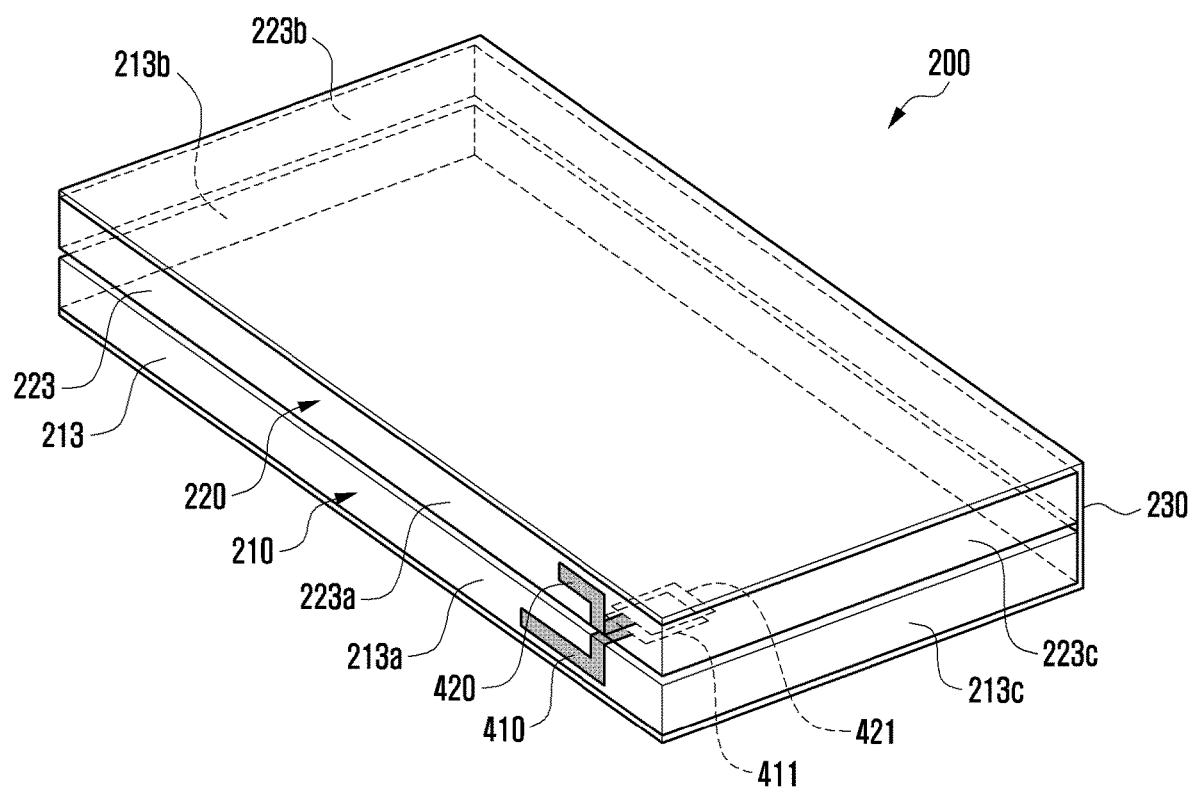
FIG. 5A is a diagram illustrating a folded state of the foldable electronic device shown in FIG. 4A.
Figure 5B:
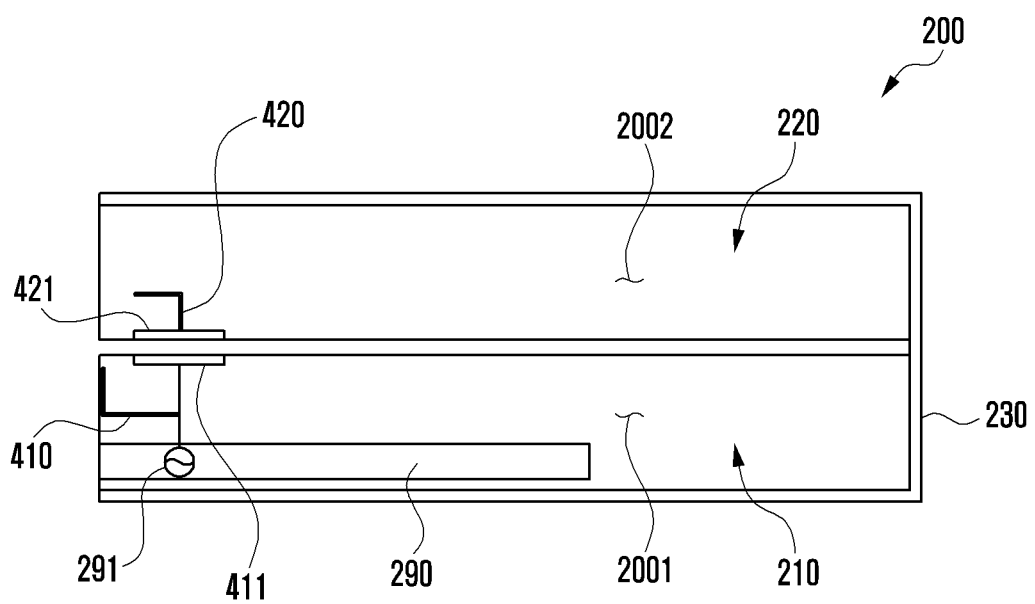
FIG. 5B is a diagram illustrating an internal configuration of the electronic device shown in FIG. 5A.
Figure 5C:
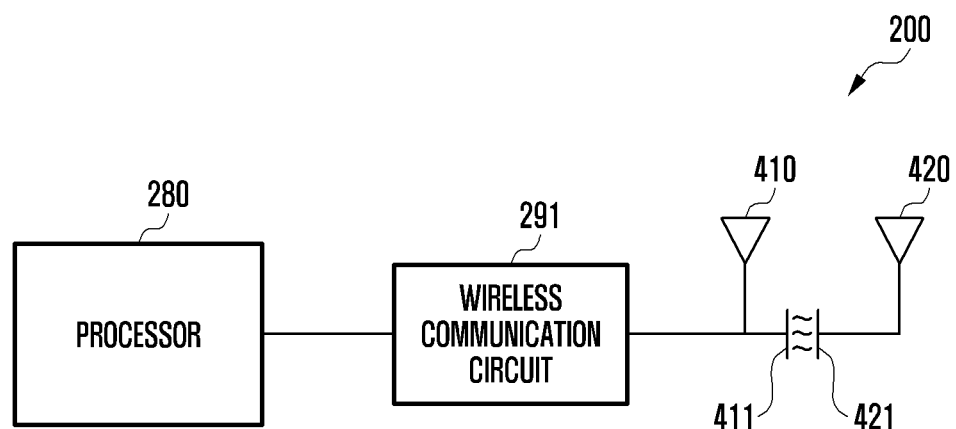
FIG. 5C is a block diagram illustrating the electronic device including an antenna shown in FIG. 5A.

FIG. 5A is a diagram illustrating a folded state of the foldable electronic device 200 shown in FIG. 4A. FIG. 5B is a diagram illustrating an internal configuration of the electronic device 200 shown in FIG. 5A. FIG. 5C is a block diagram illustrating the electronic device 200 including an antenna shown in FIG. 5A.

Referring to FIGS. 5A to 5C, when the electronic device 200 is in the folded state, the second surface 212 of the first housing 210 and the fourth surface 222 of the second housing 220 may face each other (i.e. in contact with each other or in close vicinity). In this case, radiation performance of an antenna using only the conductive pattern 410 may be degraded due to increased return loss or a shift to an unwanted frequency band caused by a conductive layer (e.g., copper plate) of the display 230. In addition, the radiation performance of the antenna using only the conductive pattern 410 may be degraded due to conductive members, such as conductive mechanical structures (e.g., conductive support member or conductive bracket) or a conductive electrical structures (e.g., interface connector port, speaker assembly, or microphone module) disposed near the antenna.

According to an embodiment of the disclosure, when the electronic device 200 is in the folded state, the first conductive pad 411 disposed in the first housing 210 and the second conductive pad 421 disposed in the second housing 220 come to adjoin each other and are disposed at positions available for electrical coupling with each other, thus being capacitively coupled to each other. In this case, the wireless communication circuit 291 may use, in addition to the conductive pattern 410, the conductor 420 electrically connected to the conductive pattern 410 through the first and second conductive pads 411 and 421 as an additional radiator. This may prevent the degradation of radiation performance due to the folded state of the electronic device 200 or exhibit better radiation characteristics.

Figure 6A:
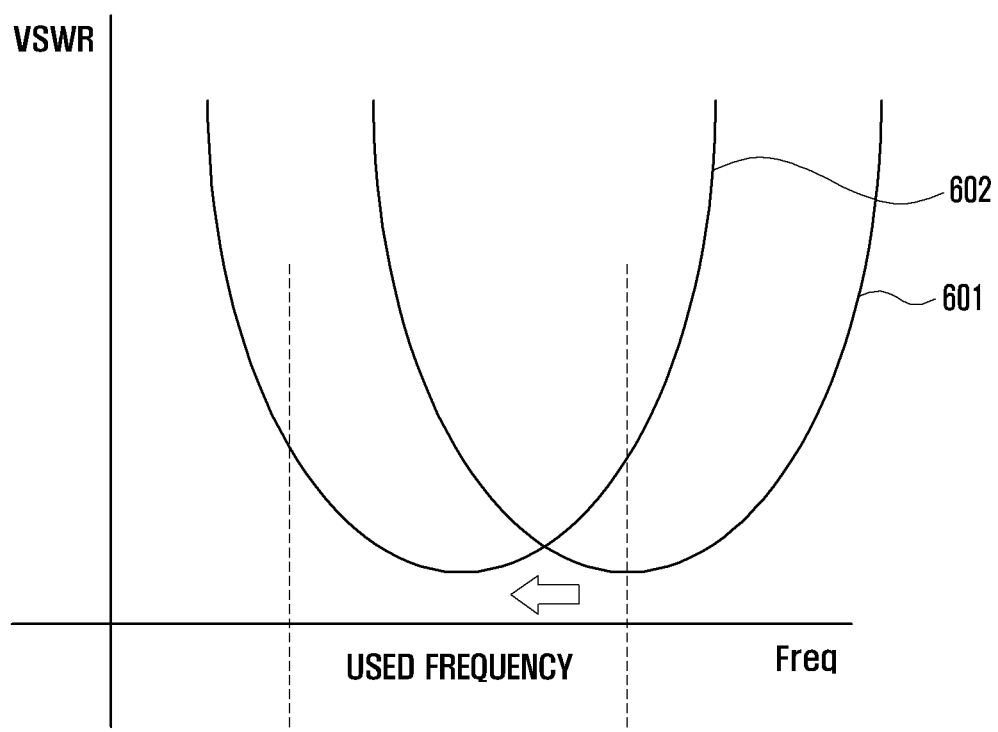
FIG. 6A is a graph comparing operating frequency bands with or without a conductor according to various embodiments of the disclosure.

FIG. 6A is a graph comparing operating frequency bands with or without a conductor (e.g., the conductor 420 in FIG. 4A) according to an embodiment of the disclosure.

Referring to FIG. 6A, when an electronic device (e.g., the electronic device 200 in FIG. 5A) is in the folded state, and when only one conductive pattern (e.g., the conductive pattern 410 in FIG. 5A) is used as the antenna, the antenna may operate at frequencies out of the operating frequency band (or used frequency band) as indicated by graph 601. In contrast, as indicated by graph 602, when the conductive pattern (e.g., the conductive pattern 410 in FIG. 5A) is capacitively coupled to the conductor (e.g., the conductor 420 in FIG. 5A) according to an embodiment of the disclosure, the antenna can operate normally in the operating frequency band.

Figure 6B:
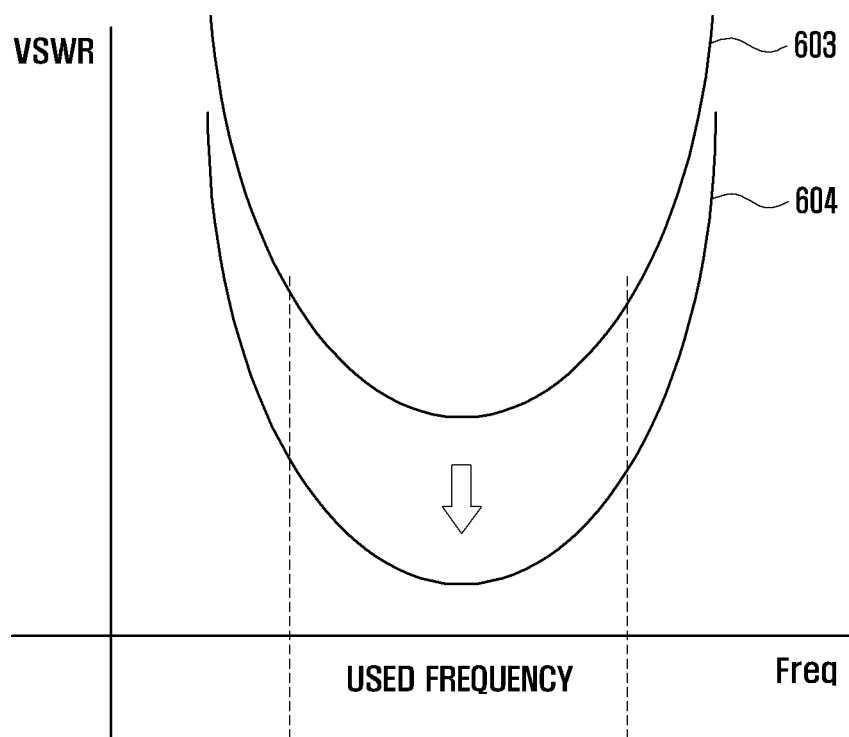
FIG. 6B is a graph comparing return loss characteristics with or without a conductor according to an embodiment of the disclosure.

FIG. 6B is a graph comparing return loss characteristics with or without a conductor (e.g., the conductor 420 in FIG. 4A) according to an embodiment of the disclosure.

Referring to FIG. 6B, when an electronic device (e.g., the electronic device 200 in FIG. 5A) is in the folded state, and when only one conductive pattern (e.g., the conductive pattern 410 in FIG. 5A) is used as an antenna, the antenna may have a high return loss in the operating frequency band (or used frequency band) as indicated by graph 603. In contrast, as indicated by graph 604, when the conductive pattern (e.g., the conductive pattern 410 in FIG. 5A) is capacitively coupled through electrical coupling to the conductor (e.g., the conductor 420 in FIG. 5A) according to an embodiment of the disclosure, the antenna can have a relatively better return loss (i.e., lower return loss) in the operating frequency band.

Figure 7A:
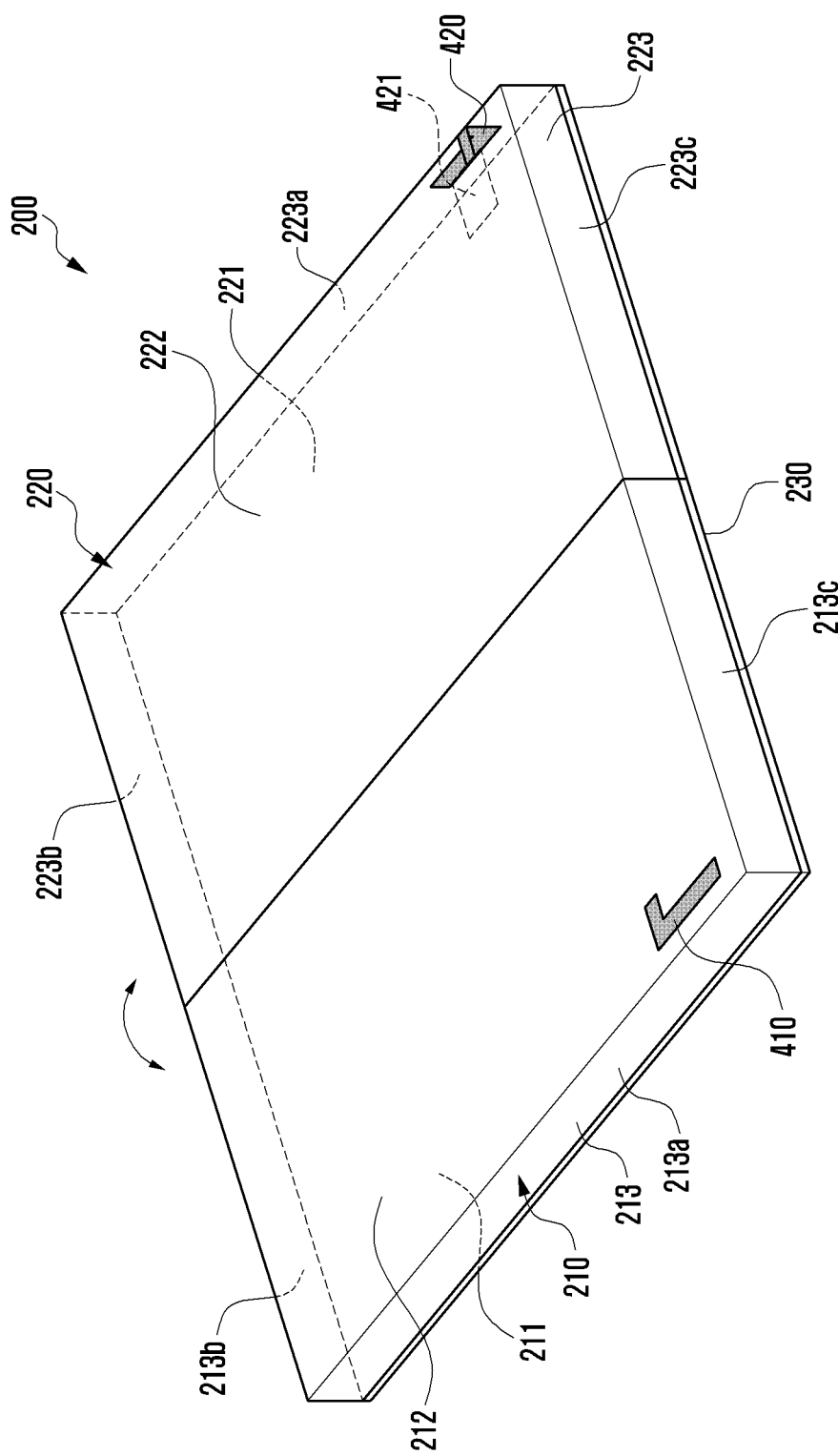
FIG. 7A is a diagram illustrating an unfolded state of a foldable electronic device including an antenna according to an embodiment of the disclosure.
Figure 7B:
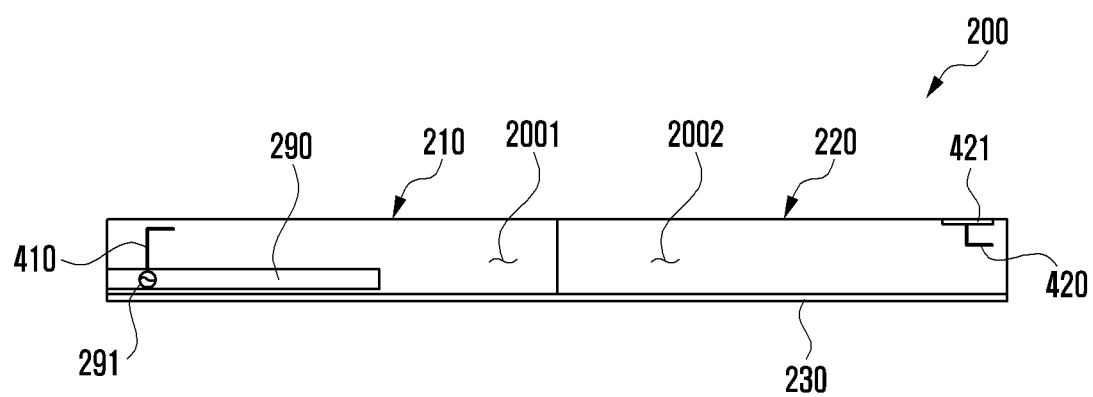
FIG. 7B is a diagram illustrating an internal configuration of the electronic device shown in FIG. 7A.
Figure 7C:
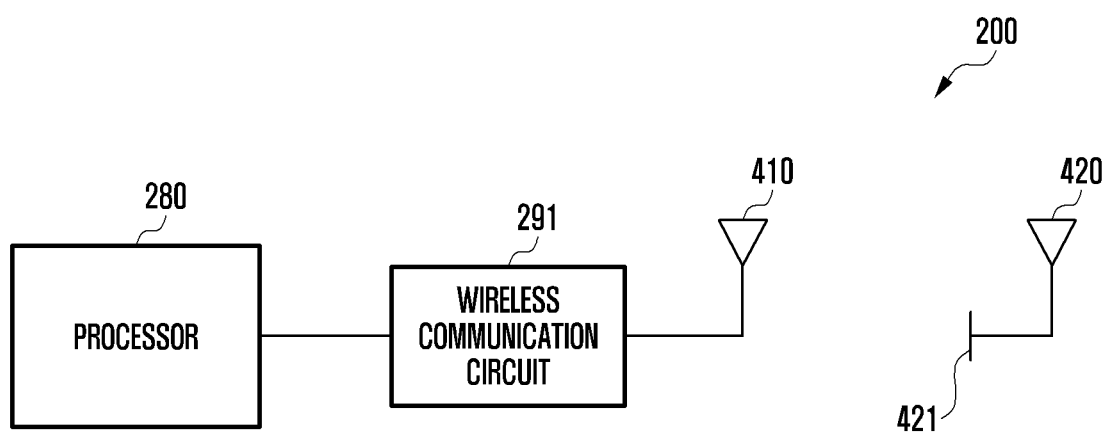
FIG. 7C is a block diagram illustrating the electronic device including an antenna shown in FIG. 7A.

FIG. 7A is a diagram illustrating an unfolded state of a foldable electronic device 200 including an antenna according to an embodiment of the disclosure. FIG. 7B is a diagram illustrating an internal configuration of the electronic device 200 shown in FIG. 7A. FIG. 7C is a block diagram illustrating the electronic device 200 including an antenna shown in FIG. 7A.

In describing the electronic device 200 shown in FIGS. 7A to 7C, detailed descriptions of similar components as those of the above-described electronic device 200 may be omitted.

Referring to FIGS. 7A to 7C, the electronic device 200 may have substantially the same configuration as the above-described configuration in FIGS. 5A to 5C except for the conductive pattern 410 disposed in the first housing 210.

According to an embodiment, the electronic device 200 may include the conductive pattern 410 to be disposed in the first space 2001 of the first housing 210. According to an embodiment, the conductive pattern 410 may be electrically connected to the wireless communication circuit 291 disposed in the first space 2001 of the first housing 210. According to an embodiment, the wireless communication circuit 291 may be mounted on the PCB 290 disposed in the first space 2001. According to an embodiment, the wireless communication circuit 291 may be configured to transmit and/or receive radio signals in the range of about 500 MHz to 6000 MHz through the conductive pattern 410. According to an embodiment, the conductive pattern 410 may be disposed in the first space 2001 to face the second surface 212. That is, the conductive pattern 410 may be disposed at a position closer to the second surface 212 than the first surface 211 in the first space 2001. In another embodiment, when the second surface 212 includes a support plate made of an injection-molded material, and the conductive pattern 410 may be formed on or be attached to an inner surface of the support plate. According to an embodiment, the conductive pattern 410 may be made of an injection-molded material (e.g., antenna carrier) which is disposed in the first space 2001 using the LDS method. In another embodiment, the conductive pattern 410 may include the FPCB having a conductive plate or pattern disposed at a suitable place in the first space 2001. In another embodiment, the conductive pattern 410 may be formed in a fill-and-cut region (i.e., non-conductive region) of the PCB 290 using a direct patterning method.

Figure 8A:
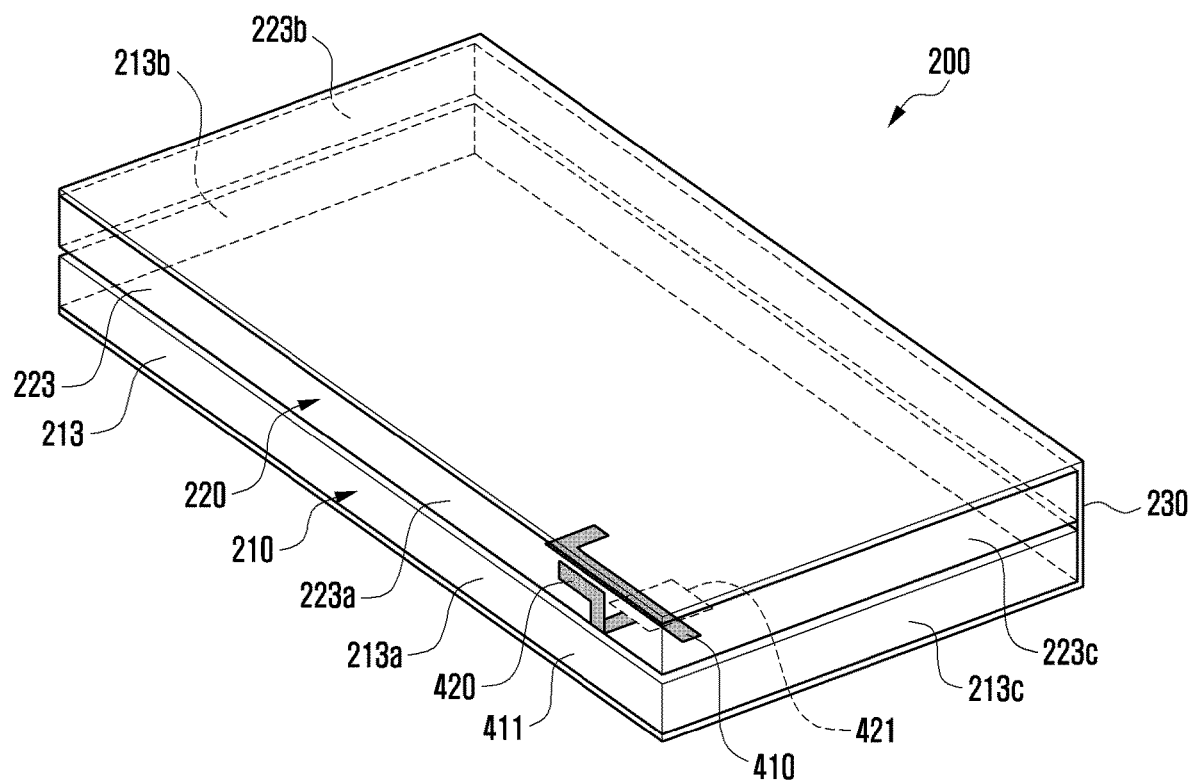
FIG. 8A is a diagram illustrating a folded state of the foldable electronic device shown in FIG. 7A.
Figure 8B:
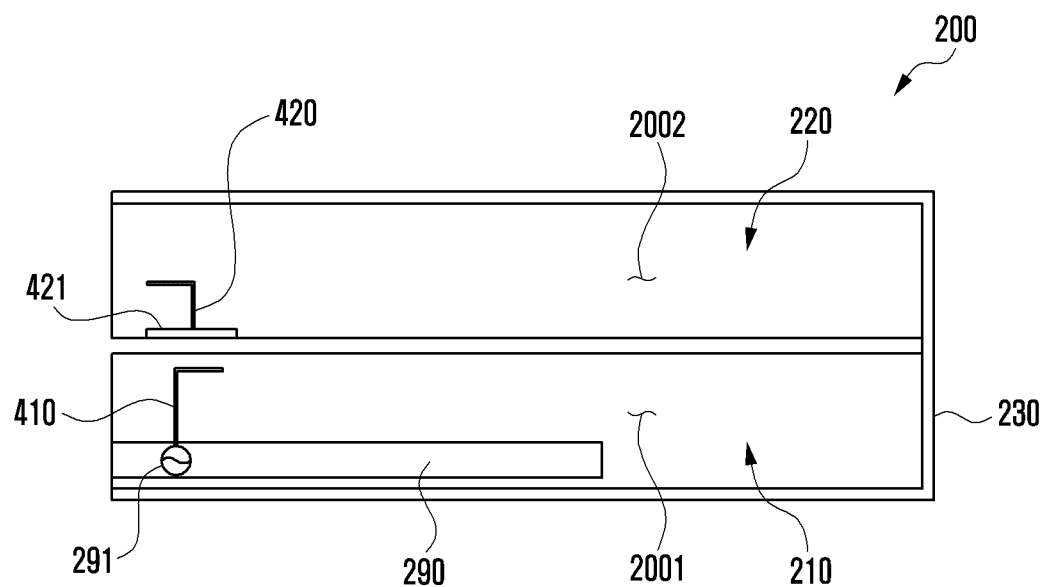
FIG. 8B is a diagram illustrating an internal configuration of the electronic device shown in FIG. 8A.
Figure 8C:
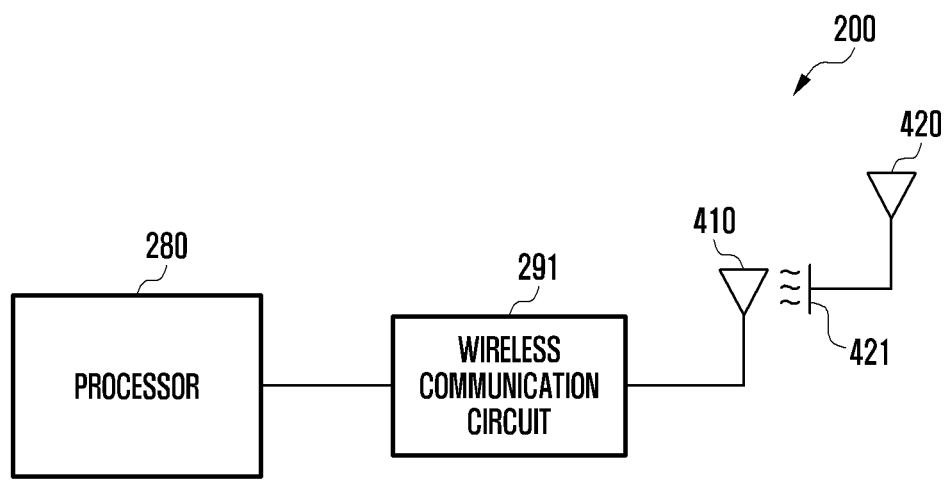
FIG. 8C is a block diagram illustrating the electronic device including an antenna shown in FIG. 8A.

FIG. 8A is a diagram illustrating a folded state of the foldable electronic device 200 shown in FIG. 7A. FIG. 8B is a diagram illustrating an internal configuration of the electronic device shown in FIG. 8A. FIG. 8C is a block diagram illustrating the electronic device including an antenna shown in FIG. 8A.

Referring to FIGS. 8A to 8C, when the electronic device 200 is in the folded state, the conductive pattern 410 disposed in the first housing 210 and the second conductive pad 421 disposed in the second housing 220 come to be adjacent to each other and are disposed at positions that lead to electrical coupling with each other. Thus, they can be capacitively coupled to each other. In this case, the wireless communication circuit 291 may use, in addition to the conductive pattern 410, the conductor 420 electrically connected to the conductive pattern 410 through the second conductive pad 421 as an additional radiator. This may prevent the degradation of radiation performance due to the folded state of the electronic device 200 or exhibit better radiation characteristics.

Figure 9A:
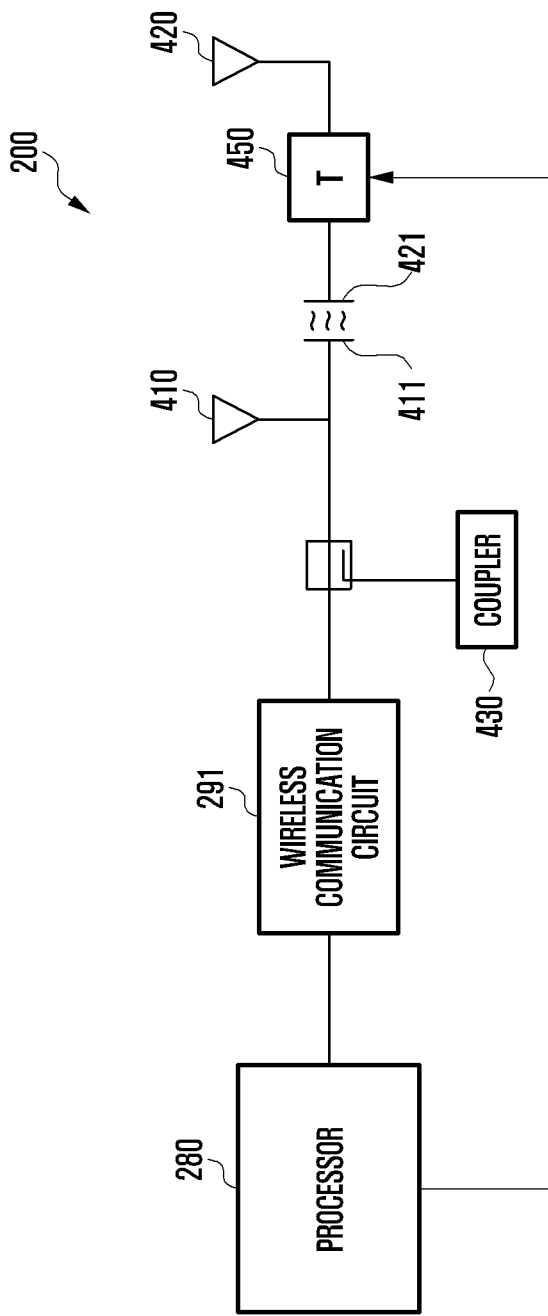
FIG. 9A is a block diagram illustrating an electronic device including a conductor having a tunable circuit according to an embodiment of the disclosure.
Figure 9B:
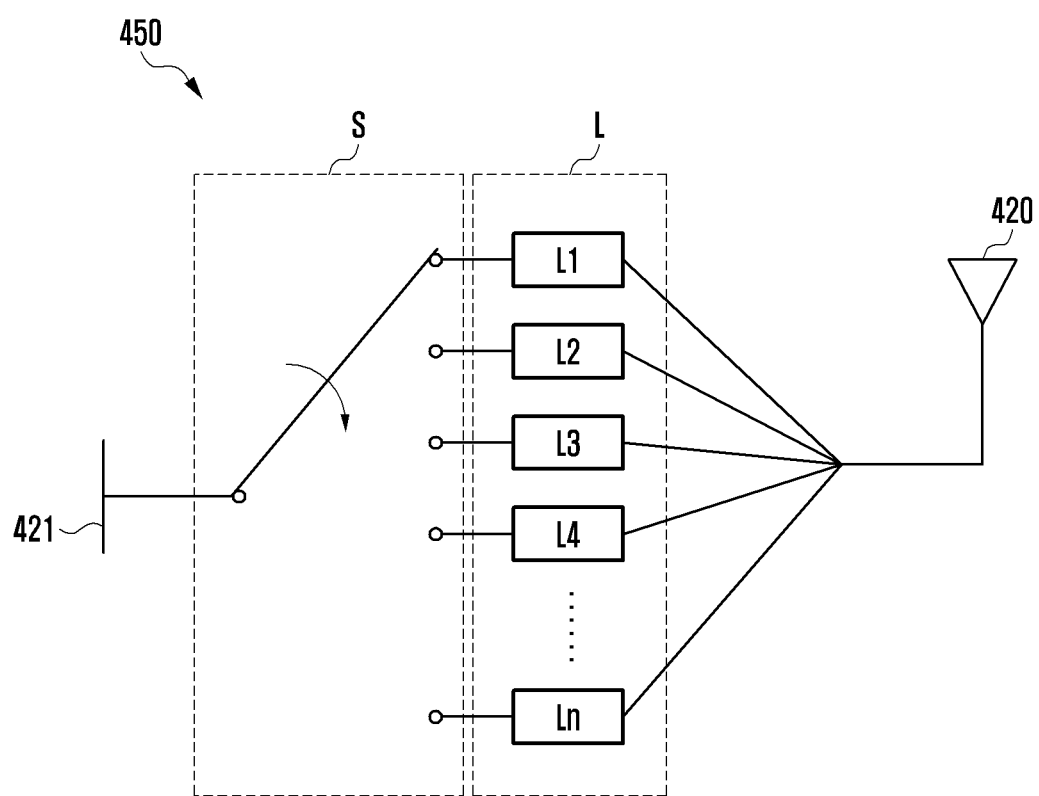
FIG. 9B is a diagram illustrating a tunable circuit according to an embodiment of the disclosure.

FIG. 9A is a block diagram illustrating an electronic device 200 including a conductor 420 having a tunable circuit (T) 450 according to an embodiment of the disclosure. FIG. 9B is a diagram illustrating a tunable circuit 450 according to an embodiment of the disclosure.

The electronic device 200 having the tunable circuit 450 shown in FIG. 9A is a modified version of the electronic device 200 shown in FIGS. 4A to 4C. However, the principles disclosed in connection with FIGS. 9A-9C may also be applied to the electronic device 200 shown in FIGS. 7A to 7C.

Referring to FIGS. 9A and 9B, the electronic device 200 may include a coupler 430 disposed on an electrical path electrically connecting the wireless communication circuit 291 and the conductive pattern 410, the tunable circuit 450 (e.g., a tunable IC) disposed on an electrical path electrically connecting the second conductive pad 421 and the conductor 420, and/or a processor 280. According to an embodiment, the processor 280 may receive return loss information (e.g., voltage standing wave ratio (VSWR) information) of the antenna from the coupler 430 through the wireless communication circuit 291, and thereby control the tunable circuit 450. In another embodiment, the processor 280 may directly receive the return loss information of the antenna from the coupler 430. According to an embodiment, based on the received return loss information, the processor 280 may control the tunable circuit 450 to improve the return loss of the antenna. The processor 280 may include a microprocessor or any suitable type of processing circuitry, such as one or more general-purpose processors (e.g., ARM-based processors), a Digital Signal Processor (DSP), a Programmable Logic Device (PLD), an Application-Specific Integrated Circuit (ASIC), a Field-Programmable Gate Array (FPGA), a Graphical Processing Unit (GPU), a video card controller, etc. In addition, it would be recognized that when a general purpose computer accesses code for implementing the processing shown herein, the execution of the code transforms the general purpose computer into a special purpose computer for executing the processing shown herein. Certain of the functions and steps provided in the Figures may be implemented in hardware, software or a combination of both and may be performed in whole or in part within the programmed instructions of a computer. No claim element herein is to be construed under the provisions of 35 U.S.C. § 112(f), unless the element is expressly recited using the phrase "means for." In addition, an artisan understands and appreciates that a "processor" or "microprocessor" may be hardware in the claimed disclosure. Under the broadest reasonable interpretation, the appended claims are statutory subject matter in compliance with 35 U.S.C. § 101.

According to an embodiment, the tunable circuit 450 may include a switching device S and a plurality of inductors L (L1, L2, L3, L4 Ln) having different inductance values L. The switching device S may switch among the plurality of inductors L. In another embodiment, the tunable circuit 450 may include at least one inductor or at least one capacitor. According to an embodiment, the tunable circuit 450 may electrically connect the second conductive pad 421 and the conductor 420 through one of the plurality of inductors L under the control of the processor 280.

Figure 9C:
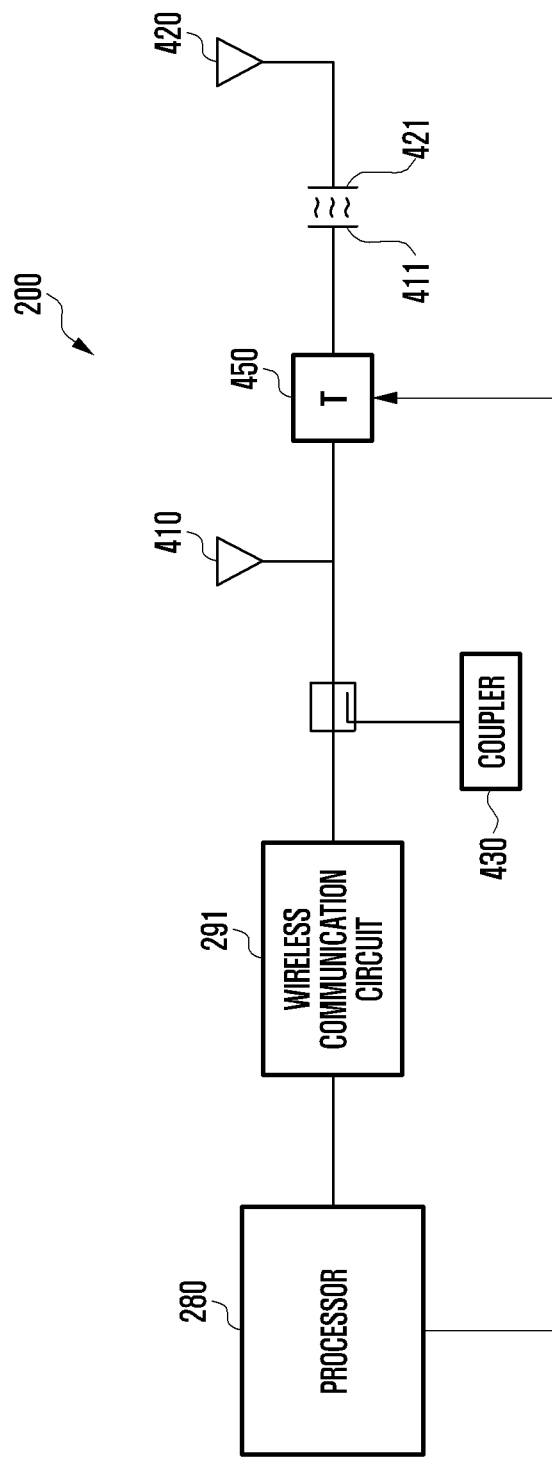
FIG. 9C is a block diagram illustrating an electronic device including a tunable circuit according to an embodiment of the disclosure.

FIG. 9C is a block diagram illustrating an electronic device 200 including a tunable circuit (T) 450 according to an embodiment of the disclosure.

Referring to FIG. 9C, the tunable circuit 450 may be disposed on an electrical path connecting the conductive pattern 410 and the first conductive pad 411. Thus, as shown in FIGS. 9A-9C, the tunable circuit 450 may be disposed at various positions on the electrical paths connecting the conductive pattern 410 and the conductor 420.

Figure 10:
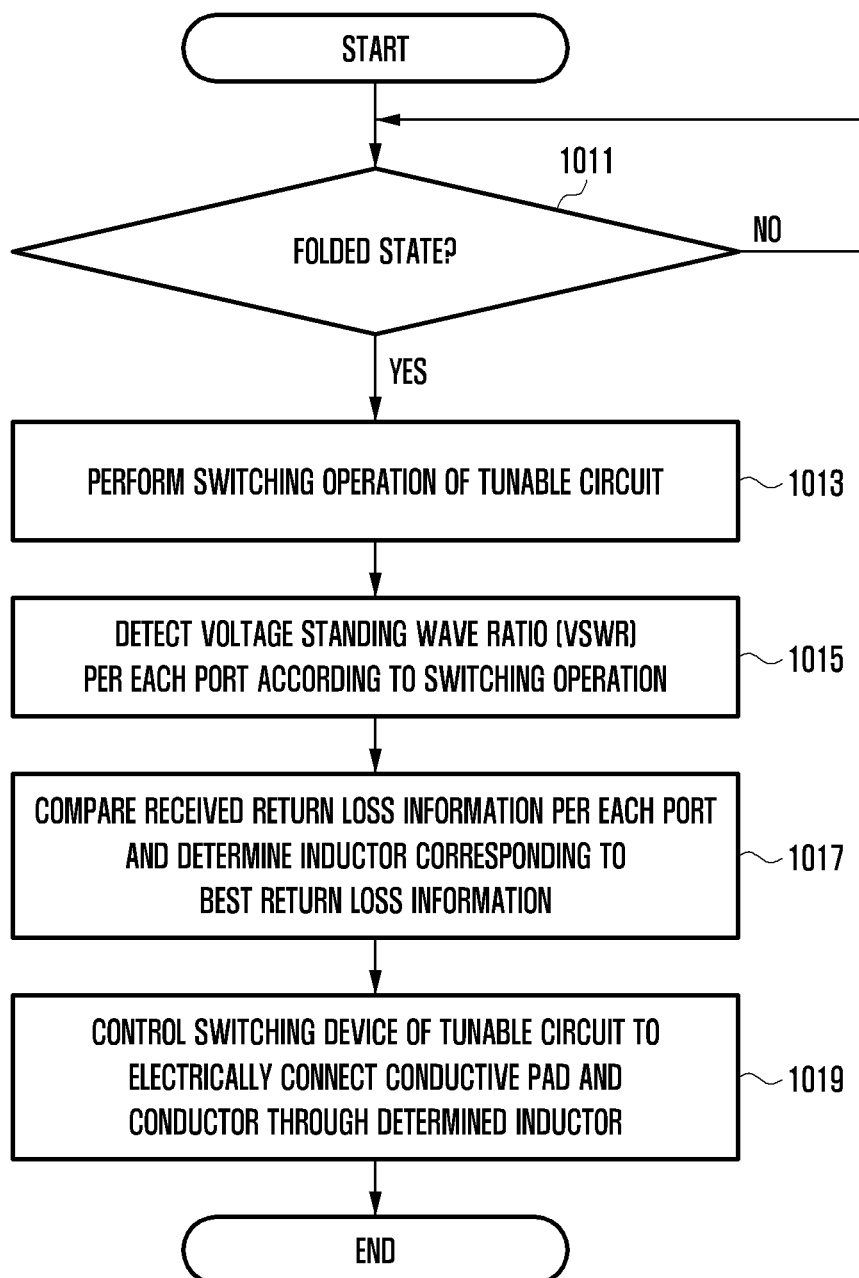
FIG. 10 is a flow diagram illustrating a switching operation of a tunable circuit for improving antenna performance according to an embodiment of the disclosure.

FIG. 10 is a flow diagram illustrating a switching operation of a tunable circuit (T) for improving antenna performance according to an embodiment of the disclosure.

Referring to FIG. 10, at operation 1011, a processor (e.g., the processor 280 in FIG. 9A) of an electronic device (e.g., the electronic device 200 in FIG. 4A) may detect whether the electronic device 200 is in the folded state. According to an embodiment, when the electronic device 200 is in the folded state, a second surface (e.g., the second surface 212 in FIG. 4A) of a first housing (e.g., the first housing 210 in FIG. 4A) and a fourth surface (e.g., the fourth surface 222 in FIG. 4A) of a second housing (e.g., the second housing 220 in FIG. 4A) may be facing each other (i.e. in contact with each other or in close proximity). In this case, a first conductive pad (e.g., the first conductive pad 411 in FIG. 4A) electrically connected to a conductive pattern (e.g., the conductive pattern 410 in FIG. 4A) of the first housing 210 and a second conductive pad (e.g., the second conductive pad 421 in FIG. 4A) electrically connected to a conductor (e.g., the conductor 420 in FIG. 4A) of the second housing 220 may be capacitively coupled to each other through electrical coupling. Therefore, the conductive pattern 410 may operate as a radiator of an antenna together with the conductor 420. According to an embodiment, the processor may detect the folded state (e.g., the state of FIG. 5A) of the electronic device 200 using a hall sensor that is disposed in one of the first and second housings 210 and 220 to detect a magnetic force of a magnet disposed in the other housing. In another embodiment, the processor 280 may detect the folded state of the electronic device 200 using a proximity sensor and/or an ultrasonic sensor disposed in one of the first and second housings 210 and 220.

According to an embodiment, at operation 1013, when the electronic device 200 is in the folded state, the processor 280 may perform a switching operation of a tunable circuit (e.g., the tunable circuit (T) 450 in FIG. 9A). According to an embodiment, the processor 280 may control a switching device (e.g., the switching device S in FIG. 9B) to electrically connect one of a plurality of inductors (e.g., the inductors L in FIG. 9B) disposed in the tunable circuit 450 to the conductive pad 421.

According to an embodiment, at operation 1015, the processor 280 may detect a voltage standing wave ratio (VSWR) per each port of the switching device S for each of the plurality of inductors L in accordance with the switching operation of the switching device S. The processor 280 may then receive corresponding return loss information through a coupler (e.g., the coupler 430 in FIG. 9A).

According to an embodiment, at operation 1017, the processor 280 may compare the received return loss information per each port. For example, based on the received return loss information per port, the processor 280 may determine one particular inductor that corresponds to the best return loss information (e.g., the lowest return loss information).

According to an embodiment, at operation 1019, the processor 280 may control the switching device S of the tunable circuit 450 to electrically connect the second conductive pad 421 and the conductor 420 through the determined inductor corresponding to the best return loss information.

According to an embodiment, the processor 280 may detect the folded state of the electronic device 200, periodically control the switching device S, and detect the antenna return loss for each inductor L through the coupler 430. Thereby, the processor 280 may select the best inductor L to enable the antenna to have the optimal radiation performance depending on the folding position of the electronic device. That is, the processor 280 may change the selection of the inductor L when the capacitance value between the conductive pads is changed due to the folding position of the electronic device.

According to an embodiment of the disclosure, even in the folded state, the antenna of the foldable electronic device is capable of using, as an antenna element, the conductor additionally disposed in the opposite housing and thereby radiation performance of an antenna of a foldable electronic device while folded may be as good as or better than the radiation performance of the antenna when the foldable electronic device is unfolded.

According to an embodiment of the disclosure, an electronic device (e.g., the electronic device 200 in FIG. 2) may include a housing including a hinge module (e.g., the hinge module 260 in FIG. 2), a first housing (e.g., the first housing 210 in FIG. 2), and second housing (e.g., the second housing 220 in FIG. 2). The first housing is connected to the hinge module and includes a first surface (e.g., the first surface 211 in FIG. 2), a second surface (e.g., the second surface 212 in FIG. 2) facing in a direction opposite to the first surface, and a first lateral member (e.g., the first lateral member 213 in FIG. 2) surrounding a first space (e.g., the first space 2001 in FIG. 4B) between the first surface and the second surface. The second housing is connected to the hinge module and including a third surface (e.g., the third surface 221 in FIG. 2), a fourth surface (e.g., the fourth surface 222 in FIG. 2) facing in a direction opposite to the third surface, and a second lateral member (e.g., the second lateral member 223 in FIG. 2) surrounding a second space (e.g., the second space 2002 in FIG. 4B) between the third surface and the fourth surface. The first and second housings are rotatably coupled to each other via the hinge module to be in a folded state or an unfolded state. The first and third surfaces face a same direction in the unfolded state, and the second and fourth surfaces face each other in the folded state. The electronic device may further include a flexible display (e.g., the flexible display 230 in FIG. 2) disposed over the first and third surfaces, at least one conductive pattern (e.g., the conductive pattern 410 in FIG. 4A) disposed in the first space, at least one conductor (e.g., the conductor 420 in FIG. 4A) disposed at a first position in the second space corresponding to the at least one conductive pattern such that the at least one conductor is capacitively coupled to the at least one conductive pattern when the electronic device is in the folded state, and a wireless communication circuit (e.g., the wireless communication circuit 291 in FIG. 4B) electrically connected to the at least one conductive pattern in the first space.

According to an embodiment, the electronic device may further include a first conductive pad (e.g., the first conductive pad 411 in FIG. 4A) disposed in the first space to be exposed through the second surface or disposed at a second position that is closer to the second surface than the first surface. The first conductive pad may be electrically connected to the at least one conductive pattern.

According to an embodiment, the electronic device may further include a second conductive pad (e.g., the second conductive pad 421 in FIG. 4A) disposed in the second space to be exposed through the fourth surface or disposed at a third position that is closer to the fourth surface than the third surface. The second conductive pad may be electrically connected to the at least one conductor, and the second conductive pad may be capacitively coupled to the first conductive pad when the electronic device is in the folded state.

According to an embodiment, the first lateral member (e.g., the first lateral member 213 in FIG. 2) may include a first lateral surface (e.g., the first lateral surface 213a in FIG. 2) disposed substantially parallel to the hinge module, a second lateral surface (e.g., the second lateral surface 213b in FIG. 2) extended to the hinge module from one end of the first lateral surface, and a third lateral surface (e.g., the third lateral surface 213c in FIG. 2) extended to the hinge module from other end of the first lateral surface. A portion of the at least one conductive pattern may be disposed to face at least one of the first lateral surface, the second lateral surface, or the third lateral surface in the first space.

According to an embodiment, the second lateral member (e.g., the second lateral member 223 in FIG. 2) may include a fourth lateral surface (e.g., the fourth lateral surface 223a in FIG. 2) disposed substantially parallel to the hinge module, a fifth lateral surface (e.g., the fifth lateral surface 223b in FIG. 2) extended to the hinge module from one end of the fourth lateral surface, and a sixth lateral surface (e.g., the sixth lateral surface 223c in FIG. 2) extended to the hinge module from other end of the fourth lateral surface. A portion of the at least one conductor may be disposed to face at least one of the fourth lateral surface, the fifth lateral surface, or the sixth lateral surface in the second space.

According to an embodiment, the first conductive pad may include a conductive decorative member when the first conductive pad is disposed to be exposed through the second surface of the first housing.

According to an embodiment, the at least one conductive pattern may include at least one of a laser direct structuring (LDS) pattern formed in a dielectric injection-molded material or a flexible printed circuit board (FPCB) having a conductive plate or pattern disposed in the first space According to an embodiment, the electronic device may further include a printed circuit board (PCB) (e.g., the PCB 290 in FIG. 4B) disposed in the first space, and the at least one conductive pattern may be formed in a fill-and-cut region of the PCB.

According to an embodiment, the wireless communication circuit may be configured to transmit and/or receive a radio signal in a range of about 500 MHz to 6000 MHz through the at least one conductive pattern and the at least one conductor when the electronic device is in the folded state.

According to an embodiment, the at least one conductive pattern may be disposed in the first space at a second position that is closer to the second surface than the first surface.

According to an embodiment, the electronic device may further include a conductive pad disposed in the second space to be exposed through the fourth surface or disposed at a second position that is closer to the fourth surface than the third surface. The conductive pad may be electrically connected to the at least one conductor, and the conductive pad may be capacitively coupled to the at least one conductive pattern when the electronic device is in the folded state.

According to an embodiment, the electronic device may further include a coupler (e.g., the coupler 430 in FIG. 9A) disposed on an electrical path connecting the wireless communication circuit and the at least one conductive pattern, a tunable circuit (e.g., the tunable circuit 450 in FIG. 9A) disposed on an electrical path connecting the conductive pad and the at least one conductor, and at least one processor (e.g., the processor 280 in FIG. 9A) configured to receive return loss information of the at least one conductive pattern from the coupler and, based on the received return loss information, control the tunable circuit.

According to an embodiment, the tunable circuit may include a plurality of inductors (e.g., the inductors L (L1, L2, L3, L4 Ln) in FIG. 9B) having different inductance values, and a switching device (e.g., the switching device S in FIG. 9B) electrically connecting the conductive pad and the at least one conductor through one of the plurality of inductors.

According to an embodiment, the at least one processor may be further configured to control the switching device to electrically connect the conductive pad to the at least one conductor sequentially through each of the plurality of inductors and, based on the received return loss information, control the switching device to electrically connect the conductive pad and the at least one conductor through an inductor having best return loss.

According to an embodiment, the at least one processor may be further configured to detect whether the electronic device is in the folded state, and control the switching device when the electronic device is in the folded state.

According to an embodiment of the disclosure, an electronic device (e.g., the electronic device 200 in FIG. 2) may include a housing including a hinge module (e.g., the hinge module 260 in FIG. 2), a first housing (e.g., the first housing 210 in FIG. 2), and second housing (e.g., the second housing 220 in FIG. 2). The first housing is connected to the hinge module and includes a first surface (e.g., the first surface 211 in FIG. 2), a second surface (e.g., the second surface 212 in FIG. 2) facing in a direction opposite to the first surface, and a first lateral member (e.g., the first lateral member 213 in FIG. 2) surrounding a first space (e.g., the first space 2001 in FIG. 4B) between the first surface and the second surface. The second housing is connected to the hinge module and including a third surface (e.g., the third surface 221 in FIG. 2), a fourth surface (e.g., the fourth surface 222 in FIG. 2) facing in a direction opposite to the third surface, and a second lateral member (e.g., the second lateral member 223 in FIG. 2) surrounding a second space (e.g., the second space 2002 in FIG. 4B) between the third surface and the fourth surface. The first and second housings are rotatably coupled to each other via the hinge module to be in a folded state or an unfolded state. The first and third surfaces face a same direction in the unfolded state, and the second and fourth surfaces face each other in the folded state. The electronic device may further include a flexible display (e.g., the flexible display 230 in FIG. 2) disposed over the first and third surfaces, at least one conductive pattern (e.g., the conductive pattern 410 in FIG. 4A) disposed in the first space, and a first conductive pad (e.g., the first conductive pad 411 in FIG. 4A) disposed in the first space to be exposed through the second surface or disposed at a first position that is closer to the second surface than the first surface. The first conductive pad may be electrically connected to the at least one conductive pattern. The electronic device may further include at least one conductor (e.g., the conductor 420 in FIG. 4A) disposed in the second space, and a second conductive pad (e.g., the second conductive pad 421 in FIG. 4A) disposed in the second space to be exposed through the fourth surface or disposed at a second position that is closer to the fourth surface than the third surface. The second conductive pad may be electrically connected to the at least one conductor, and may be capacitively coupled to the first conductive pad when the electronic device is in the folded state. The electronic device may further include a wireless communication circuit (e.g., the wireless communication circuit 291 in FIG. 4B) electrically connected to the conductive pattern in the first space, a coupler (e.g., the coupler 430 in FIG. 9A) disposed on an electrical path connecting the wireless communication circuit and the at least one conductive pattern, a tunable circuit (e.g., the tunable circuit 450 in FIG. 9A) disposed on an electrical path connecting the second conductive pad and the at least one conductor, and at least one processor (e.g., the processor 280 in FIG. 9A) configured to receive return loss information of the at least one conductive pattern from the coupler and, based on the received return loss information, control the tunable circuit.

According to an embodiment, the tunable circuit may include a plurality of inductors (e.g., the inductors L (L1, L2, L3, L4 Ln) in FIG. 9B) having different inductance values, and a switching device (e.g., the switching device S in FIG. 9B) electrically connecting the second conductive pad and the at least one conductor through one of the plurality of inductors.

According to an embodiment, the at least one processor may be further configured to control the switching device to electrically connect the second conductive pad to the at least one conductor sequentially through each of the plurality of inductors and, based on the received return loss information, control the switching device to electrically connect the second conductive pad and the at least one conductor through an inductor having best return loss.

According to an embodiment, the at least one processor may be further configured to detect whether the electronic device is in the folded state, and controls the switching device when the electronic device is in the folded state.

According to an embodiment, the wireless communication circuit may be configured to transmit and/or receive a radio signal in a range of about 500 MHz to 6000 MHz through the at least one conductive pattern and the at least one conductor when the electronic device is in the folded state.

Certain of the above-described embodiments of the present disclosure can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein.

While the disclosure has been particularly shown and described with reference to exemplary embodiments thereof, it will be understood by those skilled in the art that various changes in form and details may be made therein without departing from the scope of the subject matter as defined by the appended claims.

What is claimed is:

1. An electronic device comprising:
   a first housing including a first surface and a second surface facing in a direction opposite to the first surface;
   a second housing, wherein the first housing and the second housing are rotatably coupled to each other via a hinge module to be in a folded state or an unfolded state;
   at least one conductive pattern disposed in the first housing;
   at least one conductor disposed at a first position in the second housing corresponding to the at least one conductive pattern such that the at least one conductor is capacitively coupled to the at least one conductive pattern when the electronic device is in the folded state; and
   a wireless communication circuit electrically connected to the at least one conductive pattern in the first housing, wherein when the electronic device is in the unfolded state, the at least one conductor is disconnected from the at least one conductive pattern such that the at least one conductor is disconnected from the wireless communication circuit,
   wherein the second surface of the first housing faces the second housing in the folded state, and
   wherein the at least one conductive pattern is disposed in the first housing at a second position that is closer to the second surface than the first surface.

2. The electronic device of claim 1, further comprising a first conductive pad disposed in the first housing and electrically connected to the at least one conductive pattern, wherein:
   the first conductive pad is exposed through the second surface or disposed at a second position that is closer to the second surface than the first surface.

3. The electronic device of claim 2, further comprising a second conductive pad disposed in the second housing and electrically connected to the at least one conductor, wherein:
   the second housing includes a third surface and a fourth surface facing in a direction opposite to the third surface,
   the second conductive pad is exposed through the fourth surface or disposed at a third position that is closer to the fourth surface than the third surface, and wherein the second conductive pad is capacitively coupled to the first conductive pad when the electronic device is in the folded state.

4. The electronic device of claim 3, wherein the first housing further comprises a first lateral member, the first lateral member including:
a first lateral surface disposed substantially parallel to the hinge module;
a second lateral surface extended to the hinge module from one end of the first lateral surface; and
a third lateral surface extended to the hinge module from other end of the first lateral surface,
wherein a portion of the at least one conductive pattern is disposed to face the first lateral surface, the second lateral surface, and/or the third lateral surface in the first housing.

5. The electronic device of claim 3, wherein the second housing further comprises a second lateral member, the second lateral member including:
a fourth lateral surface disposed substantially parallel to the hinge module;
a fifth lateral surface extended to the hinge module from one end of the fourth lateral surface; and
a sixth lateral surface extended to the hinge module from other end of the fourth lateral surface,
wherein a portion of the at least one conductor is disposed to face the fourth lateral surface, the fifth lateral surface, and/or the sixth lateral surface in the second housing.

6. The electronic device of claim 3, wherein the first conductive pad further comprises a conductive decorative member when the first conductive pad is disposed to be exposed through the second surface of the first housing.

7. The electronic device of claim 1, wherein the at least one conductive pattern further comprises a laser direct structuring (LDS) pattern formed in a dielectric injection-molded material and/or a flexible printed circuit board (FPCB).

8. The electronic device of claim 1, further comprising:
a printed circuit board (PCB) disposed in the first housing,
wherein the at least one conductive pattern is formed in a fill-and-cut region of the PCB.

9. The electronic device of claim 1, wherein the wireless communication circuit is configured to transmit and/or receive a radio signal in a range of about 500 MHz to 6000 MHz through the at least one conductive pattern and the at least one conductor when the electronic device is in the folded state.

10. The electronic device of claim 1, further comprising a conductive pad disposed in the second housing and electrically connected to the at least one conductor, wherein:
the second housing includes a third surface and a fourth surface facing in a direction opposite to the third surface,
the conductive pad is exposed through the fourth surface or disposed at a second position that is closer to the fourth surface than the third surface, and
the conductive pad is capacitively coupled to the at least one conductive pattern when the electronic device is in the folded state.

11. The electronic device of claim 10, further comprising:
a coupler disposed on an electrical path connecting the wireless communication circuit and the at least one conductive pattern;
a tunable circuit disposed on an electrical path connecting the conductive pad and the at least one conductor; and at least one processor configured to:
receive return loss information of the at least one conductive pattern from the coupler, and
based on the received return loss information, control the tunable circuit.

12. The electronic device of claim 11, wherein the tunable circuit further comprises:
a plurality of inductors having different inductance values; and
a switching device electrically connecting the conductive pad and the at least one conductor through one of the plurality of inductors.

13. The electronic device of claim 12, wherein the at least one processor is further configured to:
control the switching device to electrically connect the conductive pad to the at least one conductor sequentially through each of the plurality of inductors, and
based on the received return loss information, control the switching device to electrically connect the conductive pad and the at least one conductor through an inductor having best return loss.

14. The electronic device of claim 13, wherein the at least one processor is further configured to:
detect whether the electronic device is in the folded state, and
control the switching device when the electronic device is in the folded state.

15. An electronic device comprising:
a first housing;
a second housing, wherein the first housing and the second housing are rotatably coupled to each other via a hinge module to be in a folded state or an unfolded state;
at least one conductive pattern disposed in the first housing;
a first conductive pad disposed in the first housing to be electrically connected to the at least one conductive pattern;
at least one conductor disposed in the second housing;
a second conductive pad disposed in the second housing to be electrically connected to the at least one conductor, wherein the second conductive pad is capacitively coupled to the first conductive pad when the electronic device is in the folded state;
a wireless communication circuit electrically connected to the at least one conductive pattern in the first housing;
a coupler disposed on an electrical path connecting the wireless communication circuit and the at least one conductive pattern;
a tunable circuit disposed on an electrical path connecting the second conductive pad and the at least one conductor; and
at least one processor configured to:
receive return loss information of the at least one conductive pattern from the coupler, and
based on the received return loss information, control the tunable circuit.

16. The electronic device of claim 15, wherein the tunable circuit further comprises:
a plurality of inductors having different inductance values; and
a switching device electrically connecting the second conductive pad and the at least one conductor through one of the plurality of inductors.

17. The electronic device of claim 16, wherein the at least one processor is further configured to:

control the switching device to electrically connect the second conductive pad to the at least one conductor sequentially through each of the plurality of inductors, and based on the received return loss information, control the switching device to electrically connect the second conductive pad and the at least one conductor through an inductor having best return loss.

18. The electronic device of claim 16, wherein the at least one processor is further configured to:

detect whether the electronic device is in the folded state, and control the switching device when the electronic device is in the folded state.

19. The electronic device of claim 15, wherein the wireless communication circuit is configured to transmit and/or receive a radio signal in a range of about 500 MHz to 6000 MHz through the at least one conductive pattern and the at least one conductor when the electronic device is in the folded state.

* * * * *